(12) United States Patent
Hopkins et al.

(10) Patent No.: US 12,113,019 B2
(45) Date of Patent: Oct. 8, 2024

(54) MEMORY DEVICES INCLUDING STRINGS OF MEMORY CELLS, AND RELATED ELECTRONIC SYSTEMS

(71) Applicant: Micron Technology, Inc., Boise, ID (US)

(72) Inventors: John D. Hopkins, Meridian, ID (US); Jordan D. Greenlee, Boise, ID (US); Marko Milojevic, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/148,662

(22) Filed: Dec. 30, 2022

(65) Prior Publication Data

US 2023/0148107 A1    May 11, 2023

Related U.S. Application Data

(62) Division of application No. 16/990,518, filed on Aug. 11, 2020, now Pat. No. 11,574,870.

(51) Int. Cl.
*H01L 23/522* (2006.01)
*H01L 21/762* (2006.01)
(Continued)

(52) U.S. Cl.
CPC .. *H01L 23/53209* (2013.01); *H01L 21/76264* (2013.01); *H01L 23/5226* (2013.01);
(Continued)

(58) Field of Classification Search
CPC ........ H10B 41/27; H10B 41/30; H10B 41/35; H10B 43/50; H10B 43/27; H10B 41/20;
(Continued)

(56) References Cited

U.S. PATENT DOCUMENTS

| 4,641,417 A | 2/1987 | McDavid |
| 5,780,919 A | 7/1998 | Chua et al. |

(Continued)

FOREIGN PATENT DOCUMENTS

| CN | 111785728 A | 10/2020 |
| KR | 10-2004-0051189 A | 6/2004 |

(Continued)

OTHER PUBLICATIONS

Hopkins et al., U.S. Appl. No. 16/539,700 titled Three-Dimensional Memory with Conductive Rails in Conductive Tiers, and Related Apparatus, Systems and Methods filed Aug. 13, 2019.

(Continued)

*Primary Examiner* — Galina G Yushina
(74) *Attorney, Agent, or Firm* — TraskBritt

(57) ABSTRACT

A microelectronic device comprises pillar structures extending vertically through an isolation material, conductive lines electrically coupled to the pillar structures, contact structures between the pillar structures and the conductive lines, and interconnect structures between the conductive lines and the contact structures. The conductive lines comprise one or more of titanium, ruthenium, aluminum, and molybdenum. The interconnect structures comprise a material composition that is different than one or more of a material composition of the contact structures and a material composition of the conductive lines. Related memory devices, electronic systems, and methods are also described.

18 Claims, 7 Drawing Sheets

(51) Int. Cl.
   *H01L 23/532* (2006.01)
   *H01L 27/146* (2006.01)
   *H04N 21/21* (2011.01)
   *H04N 21/422* (2011.01)
   *H10B 41/27* (2023.01)
   *H10B 41/30* (2023.01)
   *H10B 41/35* (2023.01)
   *H10N 70/00* (2023.01)

(52) U.S. Cl.
   CPC ....... *H01L 27/14636* (2013.01); *H04N 21/21* (2013.01); *H04N 21/4222* (2013.01); *H10B 41/27* (2023.02); *H10B 41/30* (2023.02); *H10B 41/35* (2023.02); *H10N 70/826* (2023.02); *H01H 2231/002* (2013.01)

(58) Field of Classification Search
   CPC ......... H01L 23/53209; H01L 21/76264; H01L 23/5226; H01L 27/14636; H01L 21/7682; H01L 21/76885; H01L 23/5222; H01L 21/764; H01L 21/76877
   See application file for complete search history.

(56) References Cited

U.S. PATENT DOCUMENTS

| | | | |
|---|---|---|---|
| 6,636,415 | B2 | 10/2003 | Tang et al. |
| 7,830,016 | B2 | 11/2010 | Meldrim et al. |
| 8,546,239 | B2 | 10/2013 | Harari et al. |
| 8,599,616 | B2 | 12/2013 | Roizin et al. |
| 8,778,749 | B2 | 7/2014 | Pachamuthu et al. |
| 9,159,739 | B2 | 10/2015 | Makala et al. |
| 9,177,853 | B1 | 11/2015 | Futase et al. |
| 9,337,203 | B2 | 5/2016 | Hwang et al. |
| 9,425,200 | B2 | 8/2016 | Hwang et al. |
| 9,460,958 | B2 | 10/2016 | Purayath et al. |
| 9,524,779 | B2 | 12/2016 | Kai et al. |
| 9,524,904 | B2 | 12/2016 | Ohori et al. |
| 9,698,149 | B2 | 7/2017 | Purayath et al. |
| 9,786,598 | B2 | 10/2017 | Kim et al. |
| 10,115,459 | B1 | 10/2018 | Yamada et al. |
| 10,236,047 | B1 | 3/2019 | Ryan et al. |
| 10,418,354 | B2 | 9/2019 | Ryu et al. |
| 10,566,333 | B2 | 2/2020 | Lee et al. |
| 10,734,400 | B1 | 8/2020 | Fukuo et al. |
| 2007/0218318 | A1 | 9/2007 | Watanabe |
| 2009/0142925 | A1 | 6/2009 | Ha et al. |
| 2010/0013107 | A1* | 1/2010 | Sandhu ............ H01L 21/76805 438/618 |
| 2011/0248252 | A1 | 10/2011 | Ohnishi et al. |
| 2012/0058639 | A1 | 3/2012 | Sim et al. |
| 2013/0168757 | A1 | 7/2013 | Hong |
| 2013/0228934 | A1 | 9/2013 | Kim et al. |
| 2013/0320050 | A1 | 12/2013 | Elliott |
| 2014/0159135 | A1 | 6/2014 | Fujimoto et al. |
| 2014/0175659 | A1 | 6/2014 | Lee et al. |
| 2014/0231908 | A1 | 8/2014 | Chen et al. |
| 2015/0076708 | A1 | 3/2015 | Kaneko et al. |
| 2015/0228531 | A1 | 8/2015 | Tagami |
| 2015/0243708 | A1 | 8/2015 | Ravasio et al. |
| 2016/0093635 | A1* | 3/2016 | Rabkin ............ H01L 21/76877 257/314 |
| 2016/0141300 | A1* | 5/2016 | Hsiao ................. H10B 43/27 257/314 |
| 2016/0141337 | A1 | 5/2016 | Shimabukuro et al. |
| 2016/0247783 | A1 | 8/2016 | Minami et al. |
| 2016/0276273 | A1 | 9/2016 | Kwon et al. |
| 2016/0276282 | A1 | 9/2016 | Tagami |
| 2017/0040207 | A1 | 2/2017 | Purayath et al. |
| 2017/0076974 | A1 | 3/2017 | Choi et al. |
| 2017/0148811 | A1 | 5/2017 | Zhang et al. |
| 2017/0256485 | A1* | 9/2017 | Tagami ............... H01L 23/5222 |
| 2017/0256551 | A1 | 9/2017 | Lee |
| 2018/0374864 | A1* | 12/2018 | Fukuzumi ............ H01L 21/185 |
| 2019/0035733 | A1 | 1/2019 | Park |
| 2019/0043876 | A1 | 2/2019 | Van et al. |
| 2019/0081049 | A1 | 3/2019 | Zang |
| 2019/0273120 | A1 | 9/2019 | Simsek-Ege et al. |
| 2020/0051993 | A1 | 2/2020 | Rabkin et al. |
| 2020/0176451 | A1 | 6/2020 | Kang et al. |
| 2020/0211843 | A1* | 7/2020 | Economy .............. C23C 16/045 |
| 2020/0266206 | A1 | 8/2020 | Fukuo et al. |
| 2020/0303308 | A1 | 9/2020 | Kitamura et al. |
| 2021/0193585 | A1 | 6/2021 | Said et al. |
| 2021/0292889 | A1* | 9/2021 | Srinivasan ......... C23C 14/3442 |

FOREIGN PATENT DOCUMENTS

| | | |
|---|---|---|
| WO | 2017/052494 A1 | 3/2017 |
| WO | 2019/036292 A1 | 2/2019 |

OTHER PUBLICATIONS

Jain et al., U.S. Appl. No. 16/743,329 title Memory Arrays and Methods Used in Forming a Memory Array filed Jan. 15, 2020.

Kaushik et al., U.S. Appl. No. 16/924,506 titled Integrated Assemblies Having Conductive-Shield-Structures Between Linear-Conductive-Structures, filed Jul. 9, 2020.

Machine Translation of CN111785728, originaly published on Oct. 16, 2020.

Mackus et al., From the Bottom-Up: Toward Area-Selective Atomic Layer Deposition with High Selectivity, Chemistry of Materials, vol. 31, (2019), pp. 2-12.

Vahdat et al., U.S. Appl. No. 16/793,263 titled Memory Arrays and methods Used in Forming a Memory Array filed Feb. 18, 2020.

* cited by examiner

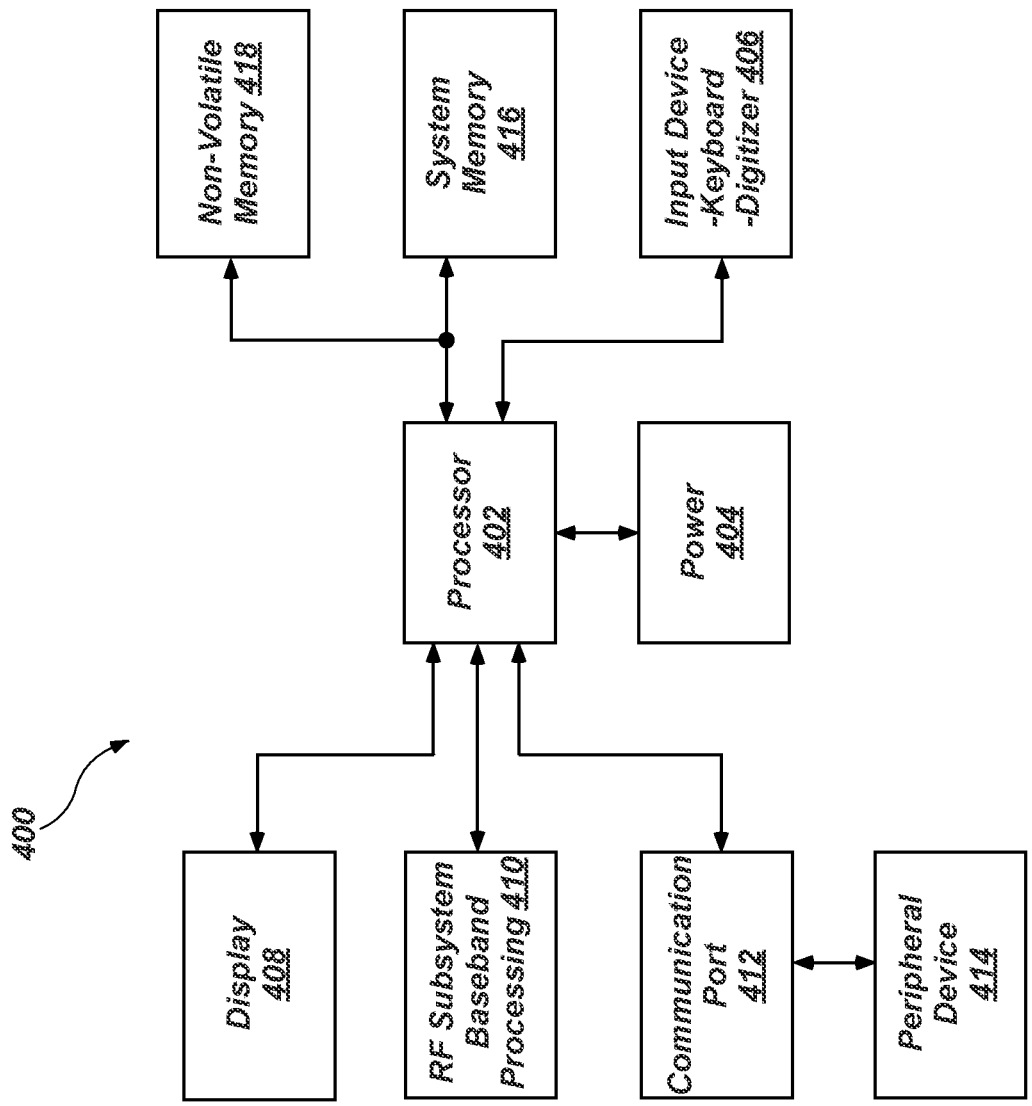

MEMORY DEVICES INCLUDING STRINGS OF MEMORY CELLS, AND RELATED ELECTRONIC SYSTEMS

CROSS-REFERENCE TO RELATED APPLICATION

This application is a divisional of U.S. patent application Ser. No. 16/990,518, filed Aug. 11, 2020, now U.S. Pat. No. 11,574,870, issued Feb. 7, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices including conductive structures, and to related memory devices, electronic systems, and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

As the dimensions and spacing of the conductive features decrease, multilevel wiring structures have been used in memory devices (e.g., 3D NAND Flash memory devices) to electrically connect the conductive features to one another. The memory device includes the wiring structures at different levels, with the wiring structures formed of electrically conductive materials to provide conductive pathways through the memory device. As the dimensions and spacing of the conductive features continue to decrease, parasitic (e.g., stray) capacitance between adjacent conductive features within the memory device increases. The increased parasitic capacitance causes higher power demands and delay of the memory device. Air gaps have been used to electrically isolate the conductive features, such as conductive structures. In addition, as the thickness of the conductive structures decreases, the resistivity of the conductive structures may increase and the conductivity may exhibit a corresponding decrease. However, a reduction in the conductivity of the conductive structures may impact performance of the strings of memory cells.

BRIEF DESCRIPTION OF THE DRAWINGS

FIG. 4 is a block diagram of a processor-based system, in accordance with embodiments of the disclosure.

DETAILED DESCRIPTION

Figure 1A:
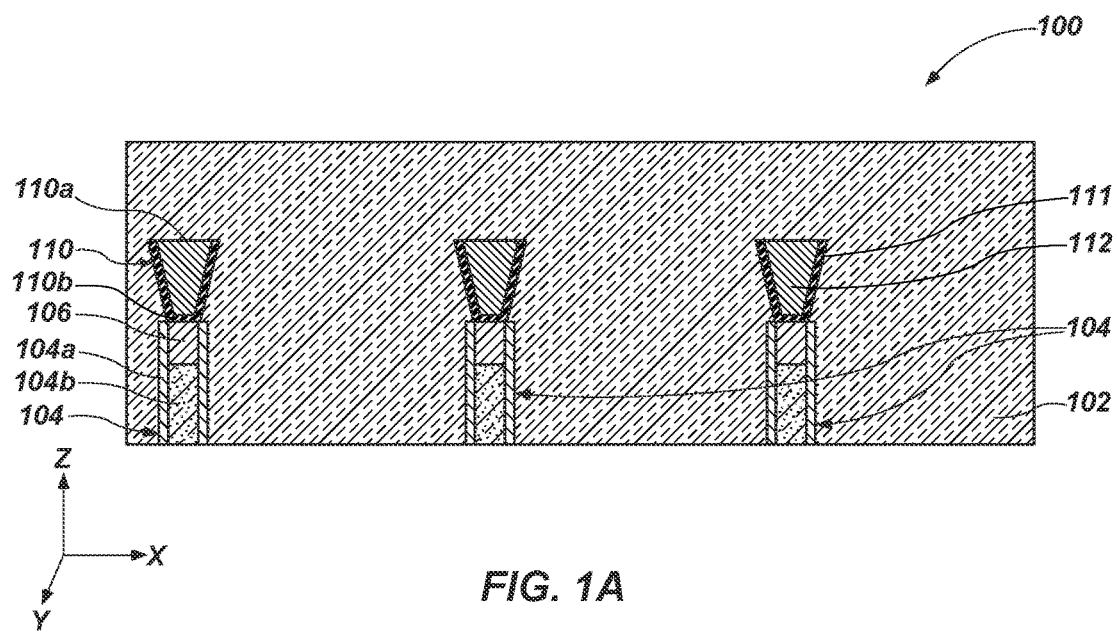
FIG. 1A through FIG. 1G are simplified partial cross-sectional views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "pitch" refers to a distance between identical points in two adjacent (i.e., neighboring) features.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "selectively etchable" means and includes a material that exhibits a greater etch rate responsive to exposure to a given etch chemistry relative to another material exposed to the same etch chemistry. For example, the material may exhibit an etch rate that is at least about three times (3×) greater than the etch rate of another material, such as about five times (5×) greater than the etch rate of another material, such as an etch rate of about ten times (10×) greater, about twenty times (20×) greater, or about forty times (40×) greater than the etch rate of the another material. Etch chemistries and etch conditions for selectively etching a desired material may be selected by a person of ordinary skill in the art.

As used herein, "subtractive patterning" refers to one or more process acts where structures to be defined are formed by the removal of material. For example, a "subtractive patterning process" may include forming etch mask structures over areas to be patterned, followed by etching, such that materials in the areas masked by the mask structures are protected while materials in exposed areas are removed by the etch removal process.

As used herein, the term "air gap" means a volume extending into or through another region or material, or between regions or materials, leaving a void in that other region or material, or between regions or materials, that is empty of a solid and/or liquid material. An "air gap" is not necessarily empty of a gaseous material (e.g., air, oxygen, nitrogen, argon, helium, or a combination thereof) and does not necessarily contain "air." An "air gap" may be, but is not necessarily, a void (e.g., an unfilled volume, a vacuum).

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random-access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

FIG. 1A through FIG. 1F illustrate a method of forming a microelectronic device structure for a microelectronic device (e.g., a memory device, such as a 3D NAND Flash memory device), in accordance with embodiments of the disclosure. Referring to FIG. 1A, a partially fabricated microelectronic device structure 100 to be employed to form an apparatus (e.g., a microelectronic device, a memory device) of the disclosure is shown. The partially fabricated microelectronic device structure 100 at the process stage shown in FIG. 1A may be formed by conventional techniques, which are not described in detail herein. The microelectronic device structure 100 includes a first isolation material 102 overlying a base material. In some embodiments, the first isolation material 102 includes a single insulative material (e.g., a dielectric material). In other embodiments, the first isolation material 102 includes a stack of alternating materials. For example, the stack of alternating materials may include alternating tiers of a first dielectric material and a second dielectric material that differ from one another. At least some of the alternating tiers of the dielectric materials of the first isolation material 102 may have been replaced with a conductive material prior to forming the microelectronic device structure 100. Therefore, the stack of alternating materials may include alternating dielectric materials and conductive materials.

The first isolation material 102 (e.g., insulative structures of the stack of alternating materials) may be formed of and include at least one dielectric material, such as one or more of a dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), a dielectric nitride material (e.g., $SiN_y$), a dielectric oxynitride material (e.g., $SiO_xN_y$), and a dielectric carboxynitride material (e.g., $SiO_xC_zN_y$). In some embodiments, the first isolation material 102 is formed of and includes $SiO_2$. The first isolation material 102 may be formed using one or more conventional deposition techniques, including, but not limited to one or more of a conventional CVD process or a conventional ALD process.

As shown in FIG. 1A, pillar structures 104 may extend vertically through the first isolation material 102. The pillar structures 104 may be formed in an array region and may be configured as memory pillar structures (e.g., channel pillar structures). The pillar structures 104 may exhibit a substantially rectangular cross-sectional shape (e.g., a substantially square cross-sectional shape). However, the disclosure is not so limited. As a non-limiting example, in additional embodiments, the pillar structures 104 exhibit a substantially circular cross-sectional shape. In addition, a pitch between horizontally neighboring pillar structures 104 may be within a range of from about 50 nanometers (nm) to about 200 nm, such as from about 50 nm to about 100 nm, from about 100 nm to about 150 nm, or from about 150 nm to about 200 nm. In some embodiments, a critical dimension of the individual pillar structures 104 in a horizontal direction is within a range of from about 20 nm to about 200 nm, such as from about 20 nm to about 50 nm, from about 50 nm to about 100 nm, from about 100 nm to about 150 nm, or from about 150 nm to about 200 nm, for example.

The pillar structures 104 may be formed in openings vertically extending (e.g., in the Z-direction) through the first isolation material 102. For example, the pillar structures 104 may be formed in high aspect ratio (HAR) openings, such as openings individually having an aspect ratio of at least about 20:1, at least about 40:1, at least about 50:1, at least about 60:1, at least about 80:1, or at least about 100:1. In some embodiments, the openings of the pillar structures 104 may have an aspect ratio within a range of from about 20:1 to about 40:1. Individual pillar structures 104 include a channel material of cell film 104a surrounding a fill material 104b. For example, the cell film 104a may include a cell material formed within the openings, and a channel material formed adjacent (e.g., over) the cell material. For convenience, the cell material and channel material are illustrated as a single material (e.g., the cell film 104a) in FIG. 1A. However, the cell film 104a is understood to include both the cell material and the channel material. The cell material and channel material are formed by conventional techniques, such as by CVD or ALD. The cell material may, for example, be an oxide-nitride-oxide (ONO) material, such as a silicon oxide-silicon nitride-silicon oxide material, that is conformally formed over sidewalls of the pillar structures 104. The cell material may be formed at a smaller relative thickness than the channel material. The channel material may be conformally formed adjacent (e.g., over) the cell material. The channel material may, for example, be polysilicon. The fill material 104b may be formed adjacent (e.g., over) the channel material of the cell films 104a, substantially filling the openings. The fill material 104b may be an insulative material, such as a high-quality silicon oxide material. For example, the fill material 104b may be a highly uniform and highly conformal silicon oxide ($SiO_x$) material (e.g., a highly uniform and highly conformal $SiO_2$ material). The fill material 104b may be highly uniform and highly conformal as deposited. The fill material 104b may be formed by conventional techniques, such as by ALD. In some embodiments, the fill material 104b is an ALD $SiO_x$. The fill material 104b may initially be formed in the openings and over exposed horizontal surfaces of the first isolation material 102, with the fill material 104b over the first isolation material 102 subsequently removed, such as by an abrasive planarization process (e.g., chemical mechanical planarization (CMP)). Accordingly, the fill material 104b is surrounded by the cell material and the channel material of the cell film 104a. At least portions of the pillar structures 104 may be operatively coupled (e.g., electrically connected) to conductive structures (e.g., word line structures, a source structure underlying the first isolation material 102), as described in further detail below with reference to FIG. 2.

With returned reference to FIG. 1A, conductive plug structures 106 (e.g., a drain contact plug material) may be formed within upper portions of the pillar structures 104. The conductive plug structures 106 may be formed on or over the fill material 104b and inwardly laterally adjacent to the channel material of the cell film 104a. The conductive plug structures 106 may be electrically coupled to the channel material of the cell film 104a. The conductive plug structures 106 may comprise a semiconductor material, such as one or more of polysilicon, silicon germanium, and germanium. The conductive plug structures 106 may be conductively doped. The process for forming the conductive plug structures 106 may be, for example, CVD or ALD.

Contact structures 110 (e.g., contacts, bit line contacts) may be formed on or over uppermost surfaces of the conductive plug structures 106. The contact structures 110 may each include outer side surfaces, upper surfaces 110a, and lower surfaces 110b adjacent to (e.g., directly vertically adjacent to) the uppermost surfaces of the conductive plug structures 106. The contact structures 110 may be formed using one or more conventional processes (e.g., conventional deposition processes, conventional material removal processes) and conventional processing equipment, which are not described in detail herein. For example, portions of a dielectric material (e.g., the first isolation material 102) overlying the conductive plug structures 106 may be removed (e.g., through a conventional photolithographic patterning and etching process) to form a plug opening overlying the conductive plug structures 106, a conductive material may be deposited into the plug opening, and the portions of the conductive material may be removed (e.g., through a CMP process) to form the contact structures 110.

The contact structures 110 may be formed of and include at least one conductive material, such as one or more of a metal, an alloy, a conductive metal oxide, a conductive metal nitride, a conductive metal silicide, and a conductively doped semiconductor material. By way of non-limiting example, the contact structures 110 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), and conductively doped silicon. In some embodiments, the contact structures 110 are formed of and includes W.

In some embodiments, the contact structures 110 are substantially homogeneous. In other embodiments, the contact structures 110 are heterogeneous. As used herein, the term "homogeneous" means amounts of a material do not vary (e.g., change) throughout different portions (e.g., different horizontal portions, different vertical portions) of another material or structure. Conversely, as used herein, the term "heterogeneous" means amounts of a material vary throughout different portions of another material or structure. For example, a liner material 111 (e.g., a conductive liner material) may be formed on or over exposed surfaces of each of the first isolation material 102 and the conductive plug structures 106 of the pillar structures 104. The liner material 111 may be conformally formed on the uppermost surfaces of the conductive plug structures 106 and on exposed side surfaces and upper surfaces of the first isolation material 102. In some embodiments, the liner material 111 substantially surrounds the side surfaces (e.g., sidewalls) of the first isolation material 102 within contact openings. The liner material 111 may be formed at any desirable thickness. By way of non-limiting example, the liner material 111 may be formed to a thickness within a range of from about 1 nm to about 10 nm, such as within a range of from about 1 nm to about 5 nm, or within a range of from about 5 nm to about 10 nm. In some embodiments, the liner material 111 is formed to a thickness of about 4 nm. The thickness of the liner material 111 may be substantially uniform along its length in at least one horizontal direction (e.g., X-direction, Y-direction) and the vertical direction (e.g., Z-direction).

The liner material 111 may be formed of and include at least one conductive material. By way of non-limiting example, the liner material 111 may be a metal material (e.g., a transition metal material) or a metal nitride material (e.g., a transition metal nitride material), such as one or more of titanium nitride ($TiN_y$), tungsten (W), tungsten nitride ($WN_y$), tantalum nitride ($TaN_y$), Cobalt (Co), molybdenum nitride ($MoN_y$), or ruthenium (Ru), where y is an integer or a non-integer. In some embodiments, the liner material 111 comprises $TiN_y$, such as TiN. In other embodiments, the liner material 111 comprises molybdenum (Mo). In yet other embodiments, the liner material 111 comprises ruthenium (Ru).

The liner material 111 may be formed using one or more conventional conformal deposition techniques, such as one or more of a conventional ALD process, a conventional conformal CVD process, and a conventional in situ growth process. Since the liner material 111 is conformally formed, a portion of the contact openings within the first isolation material 102 may remain substantially free of the liner material 111. Accordingly, the liner material 111 is formed in the contact openings without fully filling the contact openings of the first isolation material 102. In such embodiments, the liner material 111 may be formed immediately adjacent to the exposed side surfaces of the first isolation material 102 and may at least partially (e.g., substantially) cover the exposed side surfaces of the first isolation material 102 without fully filling a remaining portion (e.g., a central portion) of the contact openings within the first isolation material 102. At least portions of the liner material 111 may be subsequently removed using one or more conventional material removal processes. For example, horizontal portions of the liner material 111 initially formed on the upper surfaces of the first isolation material 102 may be removed, while portions of the liner material 111 remain on the exposed side surfaces of the first isolation material 102. Horizontal portions of the liner material 111 may or may not be removed from the uppermost surfaces of the conductive plug structures 106.

Following formation of the liner material 111, a fill material 112 may be formed adjacent to (e.g., on or over) surfaces of the liner material 111. As shown in FIG. 1A, the fill material 112 may at least partially (e.g., substantially) cover upper surfaces of the liner material 111 and extend from and between side surfaces (e.g., sidewalls) of the liner material 111 as well as over the horizontal surfaces of the liner material 111. In other words, the fill material 112 may substantially fill a remainder (e.g., unfilled portion) of the contact openings within the first isolation material 102 and may also form over the horizontal surfaces of the liner material 111. The fill material 112 may be formed in the central portion of the contact openings within the 102. In other words, the fill material 112 may substantially completely fill the central portion of the contact openings within the first isolation material 102. Accordingly, the central portion of the contact openings within the first isolation material 102 may contain the fill material 112 and may be substantially free of the liner material 111. The fill material 112 may be immediately adjacent to (e.g., in direct physical contact with) the liner material 111 and the liner material 111 may substantially surround (e.g., substantially continuously surround) the fill material 112.

The fill material 112 of the contact structures 110 may be formed of and include at least one conductive material, such as one or more of a metal, an alloy, a conductive metal oxide, a conductive metal nitride, a conductive metal silicide, and a conductively doped semiconductor material. By way of non-limiting example, the fill material 112 may be formed of and include one or more of W, $WN_y$, Ni, Ta, $TaN_y$, $TaSi_x$, Pt, Cu, Ag, Au, Al, Mo, Ti, $TiN_y$, $TiSi_x$, $TiSi_xN_y$, $TiAl_xN_y$, $MoN_x$, Ir, $IrO_z$, Ru, $RuO_z$, and conductively doped silicon. In some embodiments, the fill material 112 is formed of and includes W.

The contact structures 110 may be grown, deposited (e.g., by ALD, CVD, pulsed CVD, metal organic CVD, PVD). The liner material 111 of the contact structures 110 may be formed of and include a seed material from which the fill material 112 thereof may be formed. For example, the contact structures 110 may be formed by deposition of the liner material 111 (e.g., a titanium nitride material), followed by formation (e.g., growth, deposition) of the fill material 112 (e.g., tungsten) within the contact openings of the first isolation material 102. In some embodiments, the contact structures 110 are formed by PVD (e.g., sputtering) with a target comprising the material composition of the contact structures 110. For example, the contact structures 110 may be formed by exposing a target comprising the material composition of the contact structures 110 with an ionized gas (e.g., argon) to form (e.g., deposit) the contact structures 110 within the contact openings of the first isolation material 102. In some such embodiments, the contact structures 110 may comprise a PVD grown conductive material and may be referred to herein as a "PVD conductive material" (e.g., PVD tungsten). In some embodiments, at least some argon may be present within the contact structures 110. In other embodiments, the conductive plug structures 106 function as a seed material for the growth of the contact structures 110.

Outer side surfaces (e.g., sidewalls) of the contact structures 110 may exhibit a tapered profile with an upper portion of individual contact structures 110 having a greater critical dimension (e.g., width) than a lower portion thereof, as shown in FIG. 1A. In other embodiments, the contact structures 110 have a different profile, for example, a substantially rectangular profile, a dish-shaped profile, or any other three-dimensional recess shape, such that at least portions (e.g., a lateral extent of the upper surfaces 110a) of the contact structures 110 extend beyond sidewalls of the pillar structures 104 in at least one lateral direction (e.g., the X-direction). An additional portion of the dielectric material, collectively referred to as the first isolation material 102, may be formed on or over the upper surfaces 110a of the contact structures 110.

Figure 1B:
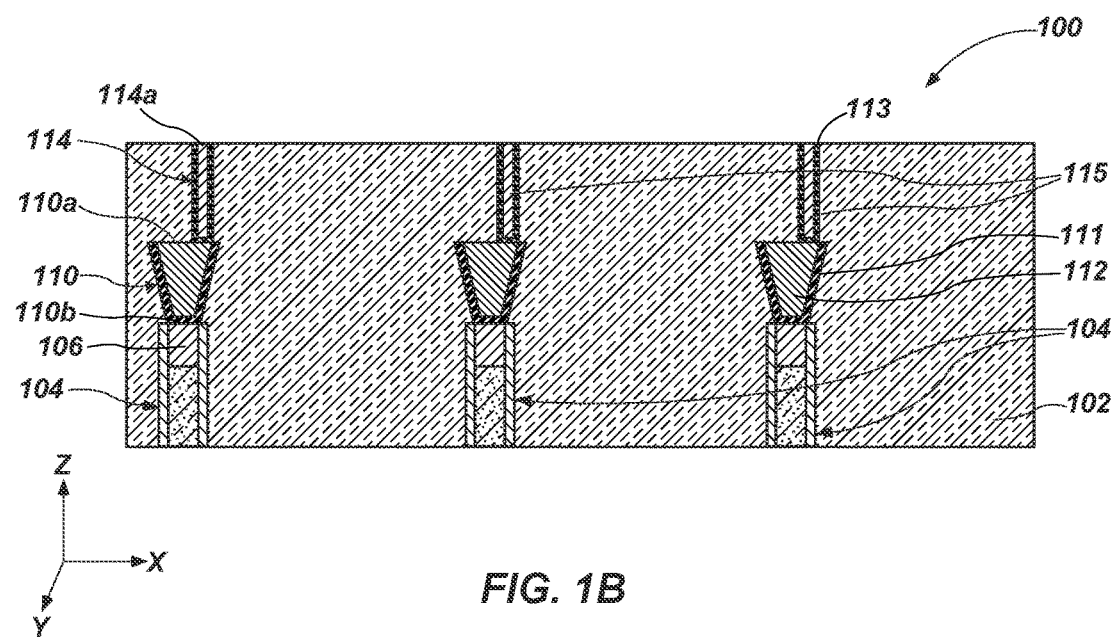

Referring next to FIG. 1B, interconnect structures 114 (e.g., filled contact vias, filled bit line vias) may be formed on or over the upper surfaces 110a of the contact structures 110. The interconnect structures 114 may each include outer side surfaces, upper surfaces 114a, and lower surfaces 114b adjacent to (e.g., directly vertically adjacent to) the upper surfaces 110a of the contact structures 110. The interconnect structures 114 may be formed using one or more conventional processes (e.g., conventional deposition processes, conventional material removal processes) and conventional processing equipment, which are not described in detail herein. For example, portions of the first isolation material 102 overlying the contact structures 110 may be removed (e.g., through a conventional photolithographic patterning and etching process) to form openings (e.g., vias, apertures) overlying the upper surfaces 110a of the contact structures 110, a conductive material may be deposited into the openings, and the portions of the conductive material may be removed (e.g., through a CMP process) to form the interconnect structures 114.

The interconnect structures 114 may be formed through a damascene process without using one or more subtractive patterning (e.g., etching) processes. In some embodiments, the interconnect structures 114 are formed using a single damascene process, in which portions of the first isolation material 102 may be selectively removed to expose respective portions of the upper surfaces 110a of the contact structures 110 and to form the openings extending through the first isolation material 102. The openings are defined by sidewalls of the first isolation material 102 and may be formed by conventional photolithography techniques. One or more dry etch processes may be used to form the openings. The conductive material of the interconnect structures 114 may be formed within the openings using chemical vapor deposition (CVD) or physical vapor deposition (PVD), for example. The interconnect structures 114 may, alternatively, or additionally, be formed using selective CVD deposition using conventional techniques, as described in further detail below. Thereafter, upper portions of the conductive material above an upper surface of the first isolation material 102 may be removed (e.g., by CMP processing) to form the interconnect structures 114.

In additional embodiments, the interconnect structures 114 are formed during formation of the contact structures 110. For example, the interconnect structures 114 may be formed substantially simultaneously with the formation of the contact structures 110 in order to simplify manufacturing processes. In other words, a conductive material of each of the contact structures 110 and the interconnect structures 114 may be deposited to substantially fill extended openings in the first isolation material 102 in a single deposition act. In such embodiments, outer side surfaces (e.g., sidewalls) of the interconnect structures 114 are initially formed to exhibit a tapered profile with an upper portion of individual interconnect structures 114 having a greater critical dimension (e.g., width) than a lower portion thereof and/or having a greater critical dimension (e.g., width) than the contact structures 110. For instance, the interconnect structures 114 may initially be formed to exhibit a lateral extent greater than a lateral extent of the contact structures 110. Portions of the outer side surfaces of the initial material of the interconnect structures 114 may be removed (e.g., etched) in one or more material removal processes such that a final dimension (e.g., final width) of the interconnect structures 114 is relatively less than that of the contact structures 110, as described in further detail with reference to FIG. 1F.

The interconnect structures 114 may be formed of and include at least one conductive material, such as one or more of a metal, an alloy, a conductive metal oxide, a conductive metal nitride, a conductive metal silicide, and a conductively doped semiconductor material. By way of non-limiting example, the interconnect structures 114 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), and conductively doped silicon. In some embodiments, the interconnect structures 114 are formed of and includes tungsten (W). The interconnect structures 114 may or may not include substantially the same material composition as the contact structures 110.

In some embodiments, the interconnect structures 114 are substantially homogeneous. In other embodiments, the interconnect structures 114 are heterogeneous. For example, a liner material 113 may, optionally, be formed on or over exposed surfaces of each of the first isolation material 102 and the contact structures 110. If present, the liner material 113 may be conformally formed on the upper surfaces 110a of the contact structures 110 and on exposed side surfaces and upper surfaces of the first isolation material 102. In some embodiments, the liner material 113 substantially surrounds the side surfaces (e.g., sidewalls) of the first isolation material 102 within the openings. The liner material 113 may be formed at any desirable thickness. By way of non-limiting example, the liner material 113 may be formed to a thickness within a range of from 1 nm to about 10 nm, such as within a range of from about 1 nm to about 5 nm, or within a range of from about 5 nm to about 10 nm. In some embodiments, the liner material 113 are formed to a thickness of about 4 nm. The thickness of the liner material 113 may be substantially uniform along its length in at least one horizontal direction (e.g., X-direction, Y-direction) and the vertical direction (e.g., Z-direction).

The liner material 113 of the interconnect structures 114 may be formed of and include at least one conductive material. By way of non-limiting example, the liner material 113 may be a metal material (e.g., a transition metal material) or a metal nitride material (e.g., a transition metal nitride material), such as one or more of $TiN_y$, W, $WN_y$, $TaN_y$, Co, Mo, $MoN_y$, or Ru, where y is an integer or a non-integer. In some embodiments, the liner material 113 comprises W. In other embodiments, the liner material 113 comprises Mo. In yet other embodiments, the liner material 113 comprises Ru. A material composition of the liner material 113 of the interconnect structures 114 may be substantially the same or different than a material composition of the liner material 111 of the contact structures 110.

The liner material 113 may be formed using one or more conventional conformal deposition techniques, such as one or more of a conventional ALD process, a conventional conformal CVD process, and a conventional in situ growth process. Since the liner material 113 is conformally formed, a portion of the openings within the first isolation material 102 may remain substantially free of the liner material 113. Accordingly, the liner material 113 is formed in the openings without fully filling the openings of the first isolation material 102. In such embodiments, the liner material 113 may be formed immediately adjacent to the exposed side surfaces of the first isolation material 102 and may at least partially (e.g., substantially) cover the exposed side surfaces of the first isolation material 102 without fully filling a remaining portion (e.g., a central portion) of the openings within the first isolation material 102. At least portions of the liner material 113 may be subsequently removed using one or more conventional material removal processes. For example, horizontal portions of the liner material 113 initially formed on the upper surfaces of the first isolation material 102 may be removed, while portions of the liner material 113 remain on the exposed side surfaces of the first isolation material 102. Horizontal portions of the liner material 113 may or may not be removed from the upper surfaces 110a of the contact structures 110.

Following formation of the liner material 113, if present, a fill material 115 may be formed on or over surfaces of the liner material 113. As shown in FIG. 1B, the fill material 115 may at least partially (e.g., substantially) cover upper surfaces of the liner material 113 and extend from and between side surfaces (e.g., sidewalls) of the liner material 113 as well as over the horizontal surfaces of the liner material 113. In other words, the fill material 115 may substantially fill a remainder (e.g., unfilled portion) of the openings within the first isolation material 102 and may also form over the horizontal surfaces of the liner material 113. The fill material 115 may be formed in the central portion of the openings within the 102. In other words, the fill material 115 may substantially completely fill the central portion of the openings within the first isolation material 102. Accordingly, the central portion of the openings within the first isolation material 102 may contain the fill material 115 and may be substantially free of the liner material 113. The fill material 115 may be immediately adjacent to (e.g., in direct physical contact with) the liner material 113, if present, and the liner material 113 may substantially surround (e.g., substantially continuously surround) the fill material 115. In other embodiments, the liner material 113 is absent from the openings and the fill material 115 is immediately adjacent to (e.g., in direct physical contact with) the first isolation material 102, as described in further detail with reference to the embodiment of FIG. 1G.

The fill material 115 of the interconnect structures 114 may be formed of and include at least one conductive material, such as one or more of a metal, an alloy, a conductive metal oxide, a conductive metal nitride, a conductive metal silicide, and a conductively doped semiconductor material. By way of non-limiting example, the fill material 115 may be formed of and include one or more of W, $WN_y$, Ni, Ta, $TaN_y$, $TaSi_x$, Pt, Cu, Ag, Au, Al, Mo, Ti, $TiN_y$, $TiSi_x$, $TiSi_xN_y$, $TiAl_xN_y$, $MoN_x$, Ir, $IrO_z$, Ru, $RuO_z$, and conductively doped silicon. In some embodiments, the fill material 115 is formed of and includes W. A material composition of the fill material 115 of the interconnect structures 114 may be substantially the same or different than a material composition of the fill material 112 of the contact structures 110.

In some embodiments, the interconnect structures 114 are formed using a PVD process or a CVD process, for example, as described above. The liner material 113 of the interconnect structures 114 may be formed of and include a material configured to enhance formation and conductivity of the fill material 115 thereof. For example, the liner material 113 may be formed of and include a single-phase material (e.g., either a β-phase tungsten material or an α-phase tungsten material) and the fill material 115 may be formed of and include another single-phase material (e.g., the other of the β-phase tungsten material or the α-phase tungsten material). The interconnect structures 114 may be formed (e.g., deposited, grown) adjacent (e.g., on, directly on) the upper surfaces 110a of the contact structures 110. In some embodiments, a phase (e.g., β-phase, α-phase) of the interconnect structures 114 depends, at least in part, on a phase (e.g., β-phase, α-phase) of the material of the contact structures 110 in embodiments that include, for example, the precursor material of the interconnect structures 114 being grown directly on the contact structures 110.

In yet other embodiments, one or more of the contact structures 110 and the interconnect structures 114 are formed using a conventional ALD process. In some such embodiments, the contact structures 110 and/or the interconnect structures 114 are formed with precursors comprising tungsten hexafluoride ($WF_6$) and silane ($SiH_4$) to form the contact structures 110 and the interconnect structures 114. Accordingly, in some embodiments, the contact structures 110 and the interconnect structures 114 are formed with halogen-containing precursors. In some such embodiments, the contact structures 110 and/or the interconnect structures 114 may include at least some of the halogen (e.g., fluorine).

For example, a precursor material (e.g., a semiconductive liner material) may be formed of and include of at least one semiconductive material, such as one or more of a silicon material, a silicon-germanium material, a boron material, a germanium material, a gallium arsenide material, a gallium nitride material, and an indium phosphide material. By way of non-limiting example, the precursor material may be formed of and include at least one silicon material. As used herein, the term "silicon material" means and includes a material that includes elemental silicon or a compound of silicon. The precursor material may, for example, be formed of and include one or more monocrystalline silicon and polycrystalline silicon. In some embodiments, the precursor material comprises polycrystalline silicon.

The precursor material may be formed to exhibit a desirable dimension (e.g., height, width) based, at least on part, on a desired dimension of the contact structures 110 and the respective interconnect structures 114 and may be formed using one or more conventional conformal deposition processes, such as one or more of a conventional conformal CVD process and a conventional ALD process. In some embodiments, the precursor material is doped (e.g., impregnated) with one or more dopants (e.g., chemical species). The dopant(s) of the doped precursor material may comprise material(s) promoting or facilitating the subsequent formation of tungsten (e.g., β-phase tungsten) from the doped precursor material, as described in further detail below. In some embodiments, the dopant(s) comprise at least one N-type dopant, such as one or more of phosphorus (P), arsenic (Ar), antimony (Sb), and bismuth (Bi). In additional embodiments, the dopant(s) comprise at least one P-type dopant, such as one or more of boron (B), aluminum (Al), and gallium (Ga). In further embodiments, the dopant(s) comprise one or more of carbon (C), fluorine (F), chlorine (Cl), bromine (Br), hydrogen (H), deuterium ($^2$H), helium (He), neon (Ne), and argon (Ar).

The precursor material of the contact structures 110 and the interconnect structures 114 may be doped with at least one dopant to form the doped precursor material using conventional processes (e.g., conventional implantation processes, conventional diffusion processes), which are not described in detail herein. As a non-limiting example, one or more phosphorus-containing species (e.g., phosphorus atoms, phosphorus-containing molecules, phosphide ions, phosphorus-containing ions) may be implanted into the precursor material to form the doped precursor material. The phosphorus-containing species may, for example, comprise phosphide ions ($P^{3-}$). As another non-limiting example, one or more arsenic-containing species (e.g., arsenic atoms, arsenic-containing molecules, arsenic ions, arsenic-containing ions) may be implanted into the precursor material to form the doped precursor material. The arsenic-containing species may, for example, comprise arsenic ions ($As^{3+}$). In some embodiments, following dopant implantation, an amount of dopant within the doped precursor material is within a range of from about 0.001 atomic percent to about 10 atomic percent. The individual portions of the doped precursor material of the contact structures 110 and/or the interconnect structures 114 may individually exhibit a substantially homogeneous distribution of dopant(s) within the semiconductive material thereof, or may individually exhibit a heterogeneous distribution of dopant(s) within the semiconductive material thereof.

Thereafter, portions of the doped precursor material may be converted into the contact structures 110 and/or the interconnect structures 114 including tungsten and the dopant(s) of the doped precursor material. The conversion process may convert portions of the semiconductive material (e.g., silicon material, such as polycrystalline silicon) of the doped precursor material including dopant(s) dispersed therein into tungsten relatively faster than an undoped semiconductive material.

At least some of the tungsten of the contact structures 110 and/or the interconnect structures 114 (e.g., collectively referred to as 'the structures') may comprise β-phase tungsten. β-phase tungsten has a metastable, A15 cubic structure. Grains of the β-phase tungsten may exhibit generally columnar shapes. Tungsten included within the structures may only be present in the β-phase or may be present in the β-phase and in the alpha (α) phase. If present, the α-phase tungsten has a metastable, body-centered cubic structure. Grains of the α-phase tungsten may exhibit generally isometric shapes. If the structures include β-phase tungsten and α-phase tungsten, an amount of β-phase tungsten included in the structures may be different than an amount of α-phase tungsten included in the structures or may be substantially the same as amount of α-phase tungsten included in the structures. In some embodiments, an amount of β-phase tungsten included in the structures is greater than an amount of α-phase tungsten included in the structures. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the structures may be present in the β-phase.

The dopant(s) included in the structures may be substantially the same as the dopant(s) included in the doped precursor material employed to form the structures. For example, dopant(s) (e.g., N-type dopants, P-type dopants, other dopants) used to form the structures may be present in the structures following formation thereof. In some embodiments, the structures include β-phase tungsten doped with one or more of As and P. The dopant(s) of the structures may support (e.g., facilitate, promote) the stability of the β-phase tungsten of the structures.

The structures (e.g., the interconnect structures 114, the contact structures 110) may exhibit a substantially homogeneous distribution of the dopant(s) thereof or may exhibit a heterogeneous distribution of the dopant(s) thereof. The distribution of the dopant(s) within the structures may be substantially the same as or may be different than a distribution of the dopant(s) within the doped precursor material.

The structures may be formed by treating the doped precursor material with one or more chemical species facilitating the conversion of the semiconductive material (e.g., silicon material) thereof into tungsten (e.g., β-phase tungsten, α-phase tungsten). By way of non-limiting example, if the doped precursor material comprises a doped silicon material, such as doped polycrystalline silicon, the doped precursor material may be treated with tungsten hexafluoride ($WF_6$) to form the structures. Silicon (Si) of the doped precursor material may react with the $WF_6$ to produce tungsten (W) and silicon tetrafluoride ($SiF_4$). The produced $SiF_4$ is removed as a gas. The produced W remains with the dopant(s) of the doped precursor material to form the structures. The doped precursor material may, for example, be treated with $WF_6$ using a conventional CVD apparatus at a temperature within a range of from about 200° C. to about 500° C.

The interconnect structures 114 may be configured to be positioned over (e.g., in direct vertical alignment with) the contact structures 110 such that at least a portion of the outer side surfaces of each of the interconnect structures 114 and the contact structures 110 are aligned with one another. In other words, the outer side surfaces of each of the interconnect structures 114 and the contact structures 110 may be elongated, continuous portions of a conductive material along at least one side thereof. In additional embodiments, the interconnect structures 114 are not aligned with the contact structures 110, such that the side surfaces of the interconnect structures 114 and the contact structures 110 are not aligned with one another along any side thereof. As shown in FIG. 1B, the interconnect structures 114 may be laterally offset (e.g., positioned off-center or staggered) in order to facilitate electrical connection with the contact structures 110. In other words, a vertical centerline of the interconnect structures 114 is positioned off-center from a vertical centerline of the contact structures 110.

Figure 1C:
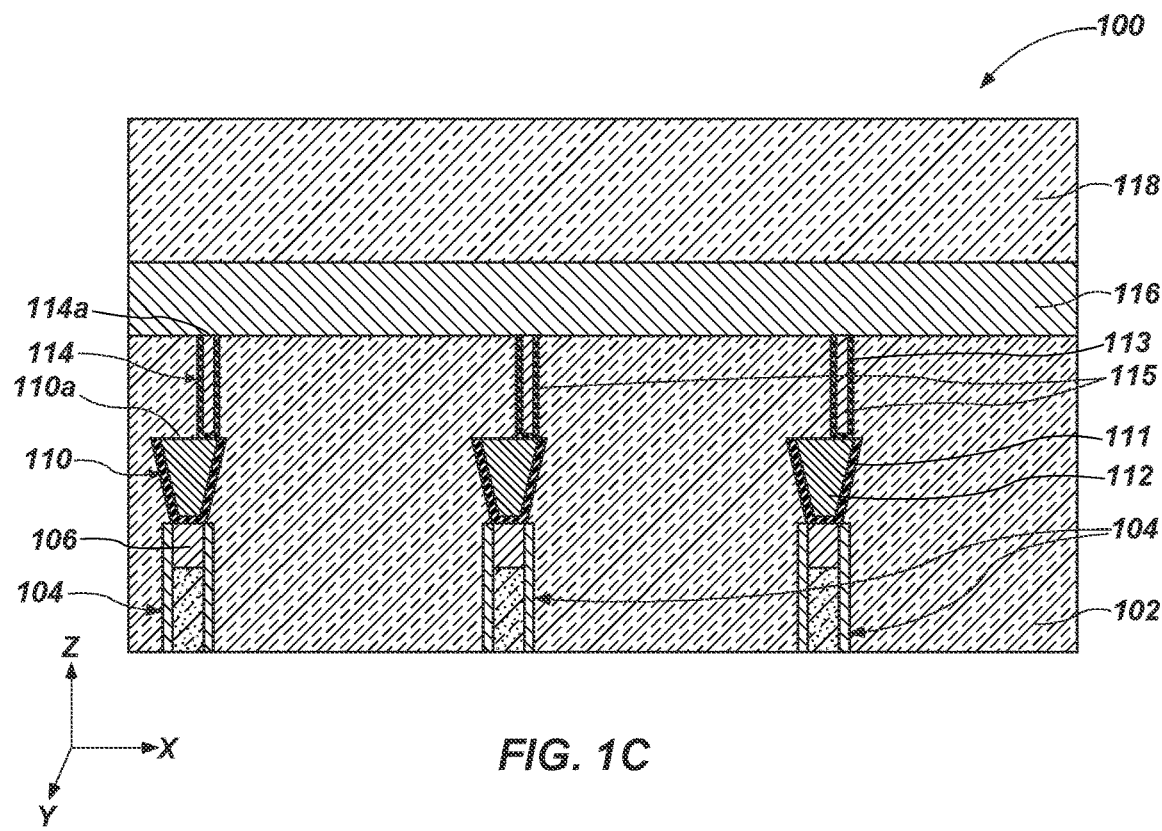

Referring to FIG. 1C, a conductive material 116 may be formed on or over upper surfaces of the first isolation material 102 and the upper surfaces 114a of the interconnect structures 114. The conductive material 116 may be formed using one or more conventional deposition processes, such as one or more of a conventional ALD process, a conventional CVD process, and a conventional PVD process. For example, conductive material 116 may be formed to exhibit a substantially continuous, flat material surface over upper surfaces of the first isolation material 102 and over the upper surfaces 114a of the interconnect structures 114. In other words, the conductive material 116 may be formed as a substantially continuous portion of material, without separation and without being formed in openings (e.g., trenches) in the first isolation material 102. The conductive material 116 may be substantially planar and may exhibit a desired thickness of subsequently formed conductive lines, as described in greater detail with reference to FIG. 1D. By initially forming the conductive material 116 as a continuous portion of the conductive material, the subsequently formed conductive lines (e.g., data lines, bit lines) may be formed without using one or more damascene processes, such as a single-damascene process or a dual-damascene process.

The conductive material 116 may be formed of and include a conductive material, such as, for example, one or more of tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including one or more of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively doped silicon, conductively doped germanium, conductively doped silicon germanium), polysilicon, and other materials exhibiting electrical conductivity. In some embodiments, the conductive material 116 comprises a material including one or more of titanium, ruthenium, aluminum, and molybdenum, while being substantially devoid (e.g., substantially absent) of tungsten. In some such embodiments, the conductive material 116 may include at least some atoms of a precursor material (e.g., chlorine, carbon, oxygen) employed to from the conductive material 116. The conductive material 116 may or may not include substantially the same material composition as the interconnect structures 114 and/or the contact structures 110.

With returned reference to FIG. 1C, dielectric material 118 may be formed on or over upper surfaces of the conductive material 116. The dielectric material 118 may be selectively etchable relative to the conductive material 116 and/or the subsequently formed materials during common (e.g., collective, mutual) exposure to a first etchant, and the conductive material 116 and/or the subsequently formed materials may be selectively etchable relative to the dielectric material 118 during common exposure to a second, different etchant.

In some embodiments, the dielectric material 118 also functions as a mask material (e.g., a mask, a resist material, an anti-reflective coating). The dielectric material 118 may also be referred to herein as a hard mask. By way of non-limiting example, the dielectric material 118 may be formed of and include at least one of amorphous carbon, silicon, a silicon oxide, a silicon nitride, a silicon oxycarbide, aluminum oxide, and a silicon oxynitride. In some embodiments, the dielectric material 118 is formed of and includes at least one dielectric oxide material (e.g., one or more of $SiO_2$ and $AlO_x$). In other embodiments, the dielectric material 118 is formed of and includes $SiN_y$. The dielectric material 118 may be homogeneous (e.g., may include a single material), or may be heterogeneous (e.g., may include a stack including at least two different materials). The dielectric material 118 may be formed using one or more conventional processes (e.g., conventional deposition processes) and conventional processing equipment, which are not described in detail herein. For example, the dielectric material 118 may be deposited (e.g., through one or more of CVD, PVD, ALD, spin-coating) over upper surfaces of the conductive material 116. In some embodiments, the dielectric material 118 is formed to have an initial height that is greater than a final height of dielectric structures 124 (FIG. 1D) formed from the dielectric material 118 in order to achieve a desired height of individual portions (e.g., individual structures) thereof following subsequent processing acts, as described in further detail below.

Figure 1D:
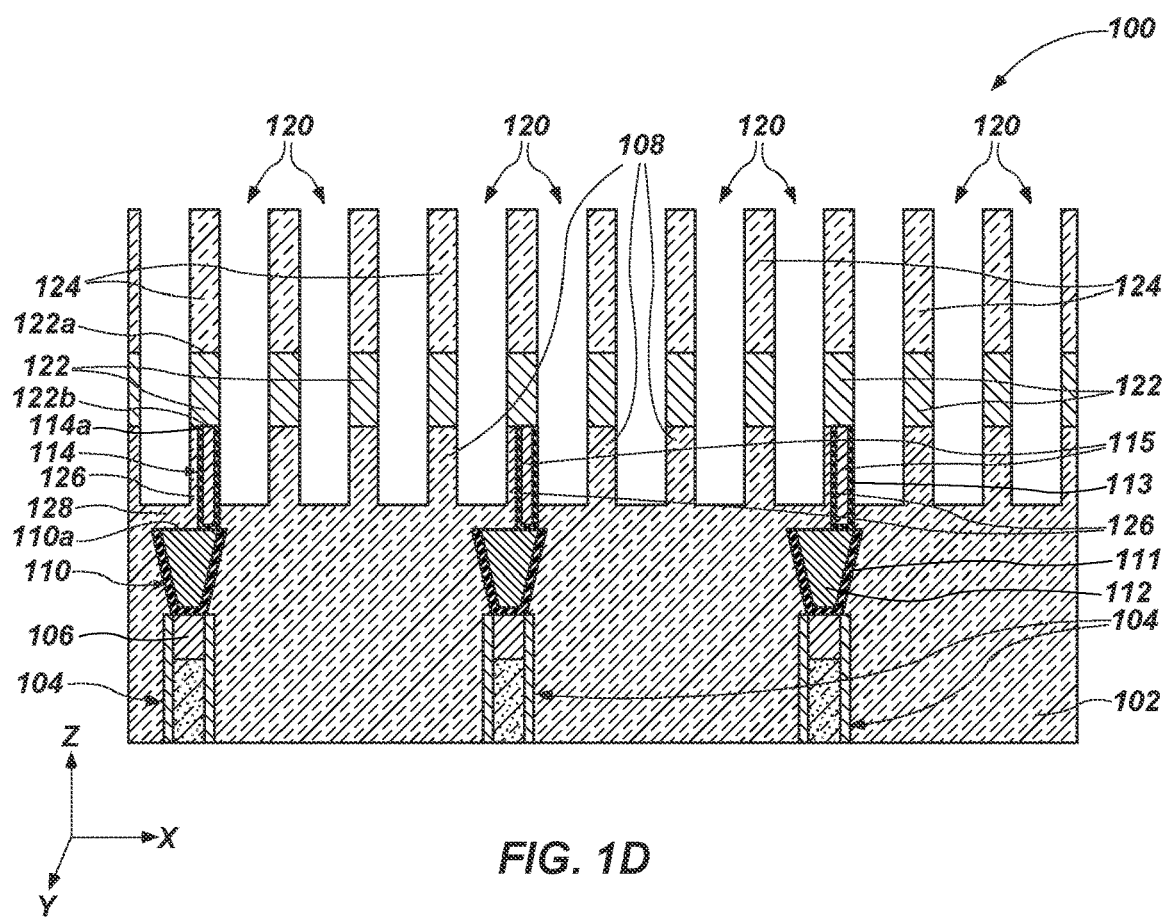

Referring next to FIG. 1D, the microelectronic device structure 100 may be patterned to form openings 120 having elongated portions extending in the second direction (e.g., the Y-direction). The openings 120 may vertically extend (e.g., in the Z-direction) through each of the dielectric material 118 (FIG. 1C), the conductive material 116 (FIG. 1C), and at least a portion of the first isolation material 102. For example, the openings 120 may be formed by transferring a pattern of openings and features of the dielectric material 118 into the conductive material 116 overlying the first isolation material 102. The patterned dielectric material 118 may be used to selectively remove (e.g., selectively etch, selectively dry etch) the underlying materials in one or more etch processes (e.g., a single etch process) to form the openings 120. The openings 120 may be formed to have a desired depth that may be selected at least partially based on a desired height of air gaps to be formed through subsequent processing of the microelectronic device structure 100, as described in further detail below with reference to FIG. 1E.

In some embodiments, portions of each of the dielectric material 118 (FIG. 1C), the conductive material 116 (FIG. 1C), and the first isolation material 102 are removed by exposing the respective materials to wet etch and/or dry etch chemistries, for example, in one or more material removal processes. Formation of the openings 120 may be used to separate the conductive material 116 into individual portions to form conductive structures 122 (e.g., conductive lines, data lines, bit lines) having elongated portions extending in the second direction, and to separate the dielectric material 118 into individual portions (e.g., segments) to form the dielectric structures 124 overlying the conductive structures 122 and having elongated portions extending in the second direction. The conductive structures 122 include upper surfaces 122a that are vertically adjacent to the dielectric structures 124 and lower surfaces 122b that are vertically adjacent to the first isolation material 102. Accordingly, the openings 120 may be located horizontally adjacent to each of the dielectric structures 124, the conductive structures 122, and portions of the first isolation material 102. Formation of the openings 120 may also horizontally intervene (e.g., in the X-direction) between remaining portions of the first isolation material 102 underlying the conductive structures 122 into segments 108. In other words, remaining portions of the first isolation material 102 vertically adjacent (e.g., underlying) the conductive structures 122 and separated on both lateral sides (e.g., in the Y-direction) by the openings 120 are designated as the segments 108 of the first isolation material 102, as shown in FIG. 1D. By controlling the amount of material removal that occurs, the openings 120 may extend into a portion of the first isolation material 102, facilitating the subsequent formation of air gaps 132 (FIG. 1E) adjacent to the dielectric structures 124, the conductive structures 122, and the segments 108 of the first isolation material 102, as described in further detail below.

To form the openings 120, the microelectronic device structure 100 (at the processing stage depicted in FIG. 1D) may be disposed in a conventional semiconductor tool (e.g., a single chamber of a material removal device, an etch device). The microelectronic device structure 100 may be exposed to one or more etchants using conventional processes (e.g., spin-coating process, a spray-coating process, an immersion-coating process, a vapor-coating process, a soaking process, combinations thereof) and conventional processing equipment, which are not described in detail herein. A total depth of the openings 120 may substantially correspond to the final height of the dielectric material 118, plus the height of the conductive material 116, plus the height of the segments 108 of the first isolation material 102. Similarly, the height of the air gaps 132 may substantially correspond to the height of the dielectric structures 124, plus the height of the conductive structures 122, plus the height of the segments 108 of the first isolation material 102. Since a thickness of the dielectric material 118 (FIG. 1C) may be reduced during formation of the openings 120 as a result of the one or more material removal acts, the dielectric material 118 may be initially be formed to have an initial height (e.g., thickness) that is greater than the final height of the dielectric structures 124 formed from the dielectric material 118 in order to achieve a desired height of the dielectric structures 124.

Forming the openings 120 includes subtractive patterning of the microelectronic device structure 100 following the processing stage previously described with reference to FIG. 1C to form the conductive structures 122 extending in the second direction (e.g., the Y-direction) as well as the dielectric structures 124 overlying the conductive structures 122 and the segments 108 underlying the conductive structures 122. The openings 120 may be formed, for example, by providing an etch mask pattern including one or more of a resist, a hard mask and an anti-reflective coating. For instance, the resist may be patterned by a photolithography process, and the pattern may be transferred into an underlying hard mask and/or antireflective layers. Alternative lithographic techniques are also possible, including processes without hard mask layers. If one or more hard mask layers are included, the resist may be removed prior to using the hard mask during etch of underlying materials. Thus, the etch mask pattern may be provided by resist and/or hard mask layers at the time of transferring the pattern into the underlying materials. In some instances, the etch mask pattern blocks areas covered by the mask pattern to protect the underlying materials from being etched (e.g., wet or dry), while the etch mask pattern exposes areas not covered by the mask pattern to etch the exposed region of the materials to be etched.

In some embodiments, the subtractive patterning process includes one or more (e.g., a single) material removal act(s) conducted in a single chamber of a conventional semiconductor tool (e.g., a material removal device, an etch device). Since the openings 120 may be formed through the dielectric material 118, the conductive material 116, and the first isolation material 102 by a single etch act, the openings 120 extend in a vertical direction adjacent to (laterally adjacent to) the dielectric structures 124, the conductive structures 122, and the segments 108 of the first isolation material 102. By utilizing the subtractive process, the openings 120 and the conductive structures 122 may be formed without using one or more damascene processes and without forming additional materials adjacent to (e.g., underlying) the conductive structures 122, which would be needed to facilitate a damascene process, for example. Conventional device structures often include another material, such as an etch stop material (e.g., a nitride material), located between conventional conductive lines (e.g., bit lines) and conventional isolation materials (e.g., an oxide material). Such nitride materials are often located adjacent to conventionally formed bit line vias and may be characterized as so-called "nitride stop-etch" materials, which materials include a material composition that is different than a material composition of the liner material 111 of the contact structures 110. According to embodiments of the disclosure, the interconnect structures 114 may be formed laterally adjacent to the first isolation material 102 (e.g., an oxide material) without being laterally adjacent a nitride material. Accordingly, forming the openings 120 and the conductive structures 122 of the microelectronic device structure 100 using the subtractive patterning process provides an improvement over conventional processes (e.g., single damascene processes) by facilitating formation of the openings 120 to a desired depth by a single process act, thus eliminating process acts while avoiding unnecessary waste of additional isolation materials (e.g., the nitride material). The interconnect structures 114 may be located directly between and operatively coupled with the contact structures 110 and the conductive structures 122.

In some embodiments, portions of the interconnect structures 114 are removed during the subtractive patterning process. In such embodiments, the dielectric structures 124 and/or the conductive structures 122 are formed to be self-aligned with the underlying conductive materials (e.g., the interconnect structures 114) using a so-called "assisted self-alignment" process. Accordingly, the dielectric structures 124 and the conductive structures 122 may be located over (e.g., in direct vertical alignment with) the interconnect structures 114 such that one of the outer side surfaces of each of the dielectric structures 124, the conductive structures 122, and the interconnect structures 114 are vertically aligned with one another. In other words, the outer side surfaces of each of the dielectric structures 124, the conductive structures 122, and the interconnect structures 114 may be in direct vertical alignment along at least one side thereof. Alternatively, or additionally, at least some of the outer side surfaces of the interconnect structures 114 may be adjacent to first residual portions 126 (e.g., remaining portions) of the first isolation material 102 laterally adjacent (e.g., between) the interconnect structures 114 and the openings 120 in a first direction (e.g., the X-direction).

The openings 120 may vertically extend from upper surfaces of the dielectric structures 124 to the first isolation material 102, without extending to upper vertical boundaries (e.g., the upper surfaces 110a) of the contact structures 110. Accordingly, a lower portion of the outer side surfaces of the interconnect structures 114 may be laterally adjacent second residual portions 128 (e.g., remaining portions) of the first isolation material 102 located vertically adjacent (e.g., between) the conductive structures 122 and the upper surfaces 110a of the contact structures 110 in the vertical direction (e.g., the Z-direction). Stated another way, remaining portions of the first isolation material 102 (e.g., the first residual portions 126 and the second residual portions 128) may form an "L-shaped" structure of the first isolation material 102 proximate the upper surfaces 110a of the contact structures 110 and the interconnect structures 114 and defining at least some of the openings 120 on at least two consecutive sides. The first residual portions 126 and the second residual portions 128 may protect the contact structures 110 and the interconnect structures 114 from subsequently conducted process acts, such as material removal acts.

Individual pillar structures 104, along with corresponding individual contact structures 110 and individual interconnect structures 114, are associated with a single (e.g., only one) of the conductive structures 122. For clarity and ease of understanding the drawings and associated description, additional pillar structures 104, along with the corresponding individual contact structures 110 and individual interconnect structures 114, are absent in FIG. 1D. In other words, each of three (3) additional pillar structures 104 of each set of four (4) of the pillar structures 104 is positioned half a pitch deeper into the plane of the page from the perspective of FIG. 1D (e.g., in the Y-direction) and is associated with three (3) of the conductive structures 122 of each set of four (4) of the conductive structures 122. However, the disclosure is not so limited, and additional configurations of the pillar structures 104, the contact structures 110, the interconnect structures 114, and the conductive structures 122 may be contemplated.

Figure 1E:
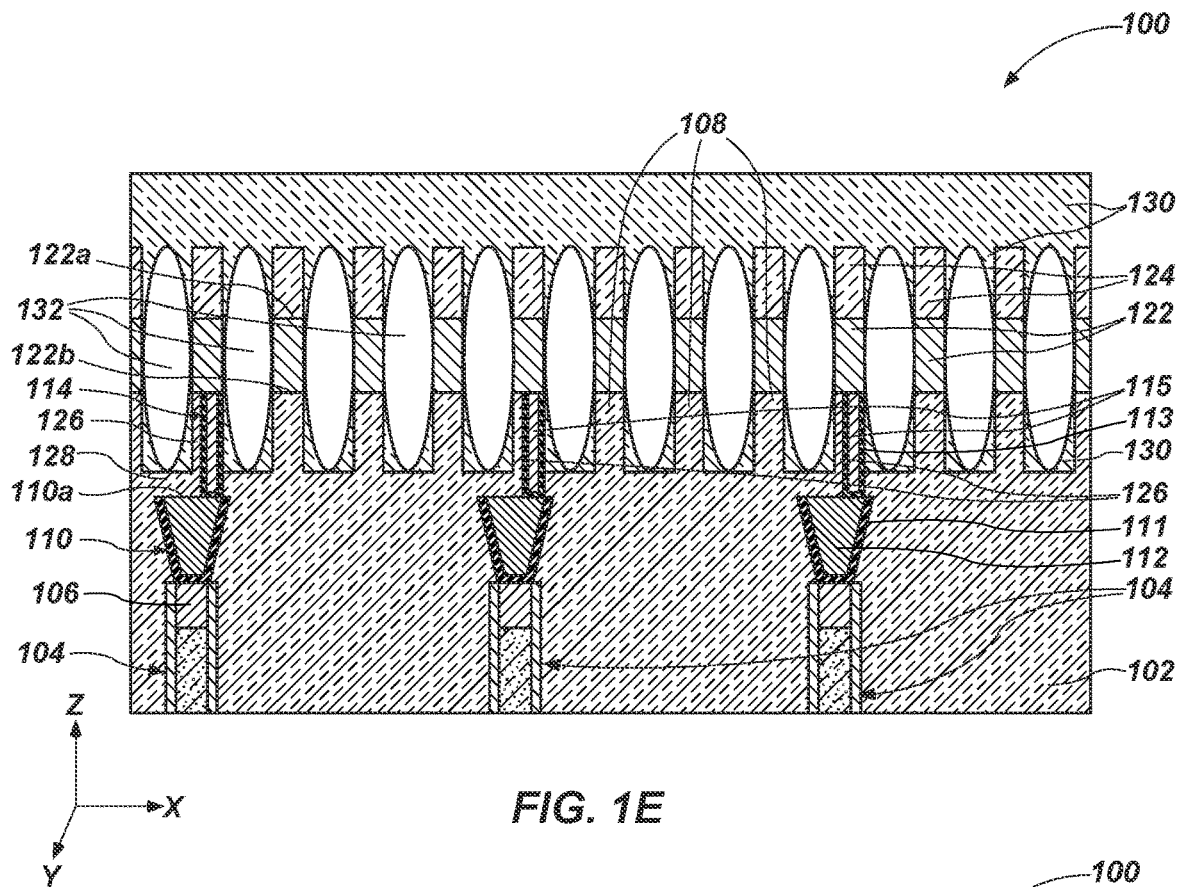

Referring next to FIG. 1E, a second isolation material 130 may be formed on or over exposed upper surfaces of the dielectric structures 124 and may cover the openings 120 (FIG. 1D) and the dielectric structures 124. A portion of the second isolation material 130 may be formed in the openings 120, such as on sidewalls of the dielectric structures 124, the conductive structures 122, and the segments 108. However, a majority of a volume of the openings 120 may be substantially free of the second isolation material 130. The second isolation material 130 may be formed proximate a top end of the openings 120 to seal unfilled spaces in a central portion therein, forming one or more of the air gaps 132 (e.g., voids, unfilled volumes) within the central portion of the openings 120. In some embodiments, at least some of the air gaps 132 include a gaseous material (e.g., air, oxygen, nitrogen, argon, helium, or a combination thereof). In other embodiments, the air gaps 132 include a vacuum (e.g., a space entirely void of matter). The air gaps 132 are partially defined by portions of the second isolation material 130 within the openings 120 and adjacent to (e.g., over) the openings 120. An upper surface of the air gaps 132 is defined by a lower surface of the second isolation material 130 over the openings 120. A lower surface of the air gaps 132 is defined by a surface of the first isolation material 102 within the openings 120, such as a horizontal surface of the first isolation material 102 at the bottom of the openings 120. Sidewalls of the air gaps 132 are defined by the second isolation material 130 within the openings 120, such as on the sidewalls of the dielectric structures 124, the conductive structures 122, and the segments 108 of the first isolation material 102. As shown in more detail in FIG. 1F, the air gaps 132 have a height $H_3$ that extends from the upper surface of the dielectric structures 124 to the surface of the first isolation material 102 at the bottom of the openings 120.

The air gaps 132 are laterally adjacent to the dielectric structures 124, the conductive structures 122, and the first residual portions 126 of the first isolation material 102. For example, the air gaps 132 are laterally adjacent to the conductive structures 122, with a portion of the air gaps 132 extending above a plane of the upper surface 122a of the laterally adjacent conductive structures 122 (e.g., laterally adjacent the dielectric structures 124) and a portion of the air gaps 132 extending below a plane of the lower surface 122b of the laterally adjacent conductive structures 122 (e.g., laterally adjacent the interconnect structures 114 and/or segments of the first isolation material 102). In other words, one or more (e.g., a single one) of the air gaps 132 extends between laterally neighboring conductive structures 122 with a vertical extent of the air gaps 132 being beyond (e.g., vertically above and vertically below) a vertical extent of the conductive structures 122. Since a portion of the air gaps 132 extends above the midpoint of the air gaps 132 and a portion of the air gaps 132 extends below the midpoint of the air gaps 132 of the conductive structures 122, the air gaps 132 may laterally intervene between adjacent conductive structures 122 and may exhibit a height in the vertical direction that is relatively greater than a height of the conductive structures 122, as described in greater detail with reference to FIG. 1F.

The air gaps 132 may be formed in the central portion of the openings 120 (FIG. 1D) and substantially extend through a height of the openings 120 following formation of the second isolation material 130. Elongated portions of the air gaps 132 may extend in the second direction (e.g., the Y-direction) with at least a portion of the air gaps 132 being located immediately adjacent to the conductive structures 122. Further, the air gaps 132 may be in direct vertical alignment with at least a portion of the contact structures 110, such that at least portions of the air gaps 132 are located directly over (e.g., vertically aligned with) portions of the contact structures 110. In some instances, the air gaps 132 may function as an insulator material having a dielectric constant (k) of about 1. The air gaps 132 may limit capacitance (e.g., parasitic capacitance, stray capacitance) and increase shorts margin between laterally-neighboring conductive structures 122 and may reduce cross-talk therebetween.

In some embodiments, portions of the second isolation material 130 are formed within the openings 120 (FIG. 1D) and adjacent to side surfaces (e.g., sidewalls) of the dielectric structures 124, the conductive structures 122, and/or the segments 108 of the first isolation material 102. The second isolation material 130 may also contact surfaces of the first isolation material 102 within a bottom portion of the openings 120. In other words, at least portions of the second isolation material 130 may be formed in the openings 120 and adjacent to (e.g., laterally adjacent to) the dielectric structures 124 and the first residual portions 126, as shown in FIG. 1E. Accordingly, at least a portion of the second isolation material 130 is laterally adjacent the first isolation material 102, in some embodiments. In other embodiments, at least some (e.g., each of) the openings 120 are substantially devoid (e.g., substantially absent, substantially entirely free) of the second isolation material 130 such that a lower vertical boundary of the second isolation material 130 is located at or above the upper surface of the dielectric structures 124 without any of the second isolation material 130 being located within the openings 120. The air gaps 132 may be configured (e.g., sized, shaped, etc.) to reduce parasitic (e.g., stray) capacitance between adjacent conductive structures 122. In some embodiments, the air gaps 132 exhibit a substantially rectangular profile in at least one horizontal direction (e.g., the X-direction), such as when the openings 120 are devoid of the second isolation material 130. In other embodiments, the air gaps 132 exhibit a substantially dish-shaped profile, such as a "V-shaped" profile or a "U-shaped" profile, in embodiments including portions of the second isolation material 130 within the openings 120. In yet other embodiments, the air gaps 132 exhibit a substantially tapered (e.g., a frustum, an inverted frustum, a substantially Y-shaped) profile or a so-called "hourglass" (e.g., a concave bow) profile, for example.

The second isolation material 130 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the second isolation material 130 is formed of and includes $SiO_2$. In other embodiments, the second isolation material 130 is formed of and includes a low-k dielectric material. The second isolation material 130 may or may not include substantially the same material composition as the at least one dielectric material (e.g., insulative structures of the stack of alternating materials) of the first isolation material 102. The second isolation material 130 may be substantially homogeneous, or the second isolation material 130 may be heterogeneous. If the second isolation material 130 is heterogeneous, amounts of one or more elements included in the second isolation material 130 may vary stepwise (e.g., change abruptly), or may vary continuously (e.g., change progressively, such as linearly, parabolically) throughout different portions of the second isolation material 130. In some embodiments, the second isolation material 130 is substantially homogeneous. In further embodiments, the second isolation material 130 is heterogeneous. The second isolation material 130 may, for example, be formed of and include a stack (e.g., laminate) of at least two different dielectric materials.

The second isolation material 130 may be formed using conventional processes (e.g., conventional deposition processes, such as one or more of spin-on coating, blanket coating, CVD and PVD; conventional material removal processes, such as a conventional CMP process) that achieve the air gaps 132 and conventional processing equipment, which are not described in detail herein. For example, the second isolation material 130 may be formed on or over portions of the exposed surfaces of the dielectric structures 124 using one or more conventional non-conformal deposition processes (e.g., at least one conventional non-conformal PVD process). Thereafter, the second isolation material 130 may be subjected to at least one conventional planarization process (e.g., at least one conventional CMP process) to facilitate or enhance the planarity of an upper boundary (e.g., upper surface) of the second isolation material 130. The dielectric structures 124 may remain in the microelectronic device structure 100 following formation of the second isolation material 130 in order to facilitate formation of the air gaps 132 adjacent to the conductive structures 122. By using the dielectric material 118 (FIG. 1C) of the dielectric structures 124 as a mask during the subtractive patterning process and by allowing formation of the air gaps 132 adjacent to the conductive structures 122, the dielectric structures 124 serves more than one (e.g., a dual) purpose by allowing the microelectronic device structure 100 to be formed utilizing fewer process acts and fewer materials than conventional device structures.

Figure 1F:
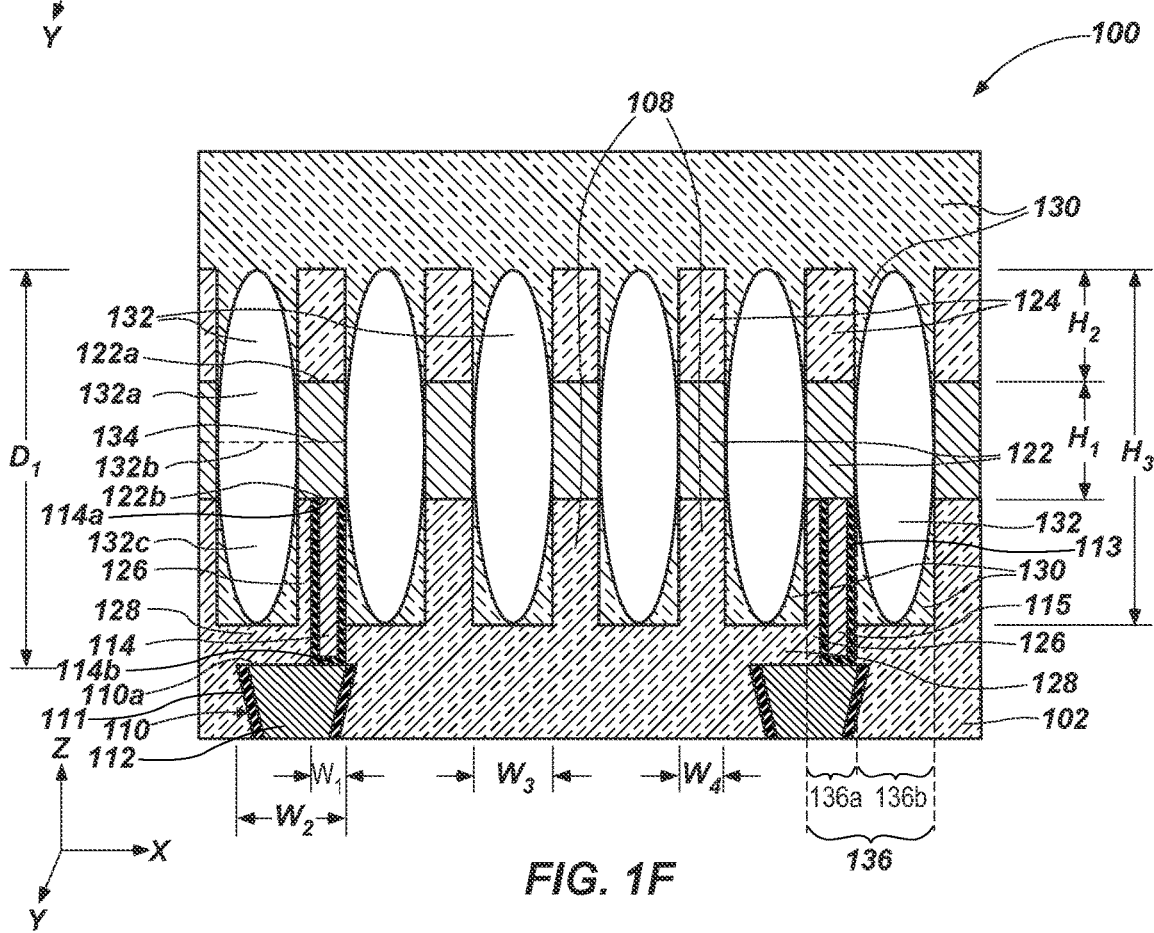

FIG. 1F is an enlarged view of a portion of the microelectronic device structure 100 of FIG. 1E. As shown in FIG. 1F, individual air gaps 132 may include an upper portion 132a, a central portion 132b (e.g., a midpoint), and a lower portion 132c. The upper portion 132a is separated from the lower portion 132c, for illustrative purposes, by the central portion 132b. The central portion 132b may be laterally adjacent to the vertical midpoint 134 (e.g., a half-way point in the vertical direction) of the conductive structures 122, with a portion of the air gaps 132 extending above the central portion 132b of the air gaps 132 and a portion of the air gaps 132 extending below the central portion 132b of the air gaps 132 relative to the vertical midpoint 134 of the conductive structures 122. In some embodiments, a height of the upper portion 132a and the lower portion 132c are substantially the same, such that a height in the vertical direction of the upper portion 132a of the air gaps 132 is substantially the same as (e.g., substantially equal to) a height in the vertical direction of the lower portion 132c of the air gaps 132.

While the microelectronic device structure 100 is illustrated in FIG. 1F as comprising a particular (e.g., symmetric) orientation of the upper portion 132a and the lower portion 132c of the air gaps 132 relative to the vertical midpoint 134 of the conductive structures 122, such an arrangement is shown for illustrative purposes only and that any configuration of the microelectronic device structure 100 including other (e.g., asymmetric) orientations of the upper portion 132a and the lower portion 132c of the air gaps 132 relative to the vertical midpoint 134 of the conductive structures 122 may be contemplated. For example, the upper portion 132a and the lower portion 132c may extend unequal heights above and below the central portion 132b such that the height of the upper portion 132a of at least some of the air gaps 132 is different than (e.g., substantially unequal to) the height of the lower portion 132c. For example, the height of the upper portion 132a may be greater than or, alternatively, less than the height of the lower portion 132c in at least some of the air gaps 132. The height of the upper portion 132a and of the lower portion 132c of the air gaps 132 relative to the central portion 132b may be due, at least in part, to a height of the dielectric structures 124 above the central portion 132b and to a height of the openings 120 within the first isolation material 102. The vertical orientation of the air gaps 132 may be tailored (e.g., selected) to meet design criteria of specific device structures.

The conductive material 116 (FIG. 1C) of the conductive structures 122, may be formed to have a desired height $H_1$. The height $H_1$ of the conductive material 116 may be selected at least partially based on a desired height of the conductive structures 122. By way of non-limiting example, the height $H_1$ of the conductive structures 122 may be within a range of from about 5 nm to about 50 nm, such as from about 5 nm to about 10 nm, from about 10 nm to about 20 nm, from about 20 nm to about 30 nm, from about 30 nm to about 40 nm, or from about 40 nm to about 50 nm.

The dielectric material 118 (FIG. 1C) of the dielectric structures 124, may be formed to have a desired height $H_2$. As described above with reference to FIG. 1D, the dielectric material 118 may initially be formed to have a greater height in order to achieve the desired height $H_2$ of the dielectric structures 124. The height $H_2$ of the dielectric structures 124 may be selected at least partially based on a desired vertical offset (e.g., in the Z-direction) between the conductive structures 122 and additional structures to be formed on or over the dielectric structures 124 through subsequent processing of the microelectronic device structure 100. The height $H_2$ of the dielectric structures 124 may be selected at least partially based on a desired height of the air gaps 132 located between adjacent conductive structures 122 and extending above the central portion 132b. By way of non-limiting example, the height $H_2$ of the dielectric structures 124 may be within a range of from about 5 nm to about 50 nm, such as from about 5 nm to about 10 nm, from about 10 nm to about 20 nm, from about 20 nm to about 30 nm, from about 30 nm to about 40 nm, or from about 40 nm to about 50 nm. In some embodiments, the height $H_2$ of the dielectric structures 124 is substantially equal to the height $H_1$ of the conductive structures 122.

As described above with reference to FIG. 1E, the air gaps 132 are laterally adjacent to the conductive structures 122, with the upper portion 132a of the air gaps 132 extending above a plane of the upper surface 122a of the laterally adjacent conductive structures 122 (e.g., laterally adjacent the dielectric structures 124) and the lower portion 132c of the air gaps 132 extending below a plane of the lower surface 122b of the laterally adjacent conductive structures 122 (e.g., laterally adjacent the interconnect structures 114 and/or the segments 108 of the first isolation material 102) without being laterally adjacent to the contact structures 110. Accordingly, the upper portion 132a of individual air gaps 132 extends laterally adjacent the dielectric structures 124 and laterally adjacent an upper portion of the conductive structures 122 (e.g., above the vertical midpoint 134 thereof) and the lower portion 132c extends laterally adjacent the interconnect structures 114 and/or the segments 108 of the first isolation material 102 and laterally adjacent a lower portion of the conductive structures 122 (e.g., below the vertical midpoint 134 thereof). The openings 120 may be formed to have a desired height $H_3$. The height $H_3$ of the openings 120 may be selected at least partially based on a desired height of the air gaps 132 formed therein. In some embodiments, the height $H_3$ of the air gaps 132 corresponds to the height $H_3$ of the openings 120. By way of non-limiting example, the height $H_3$ of the openings 120 and, thus, the air gaps 132, may be within a range of from about 30 nm to about 200 nm, such as from about 30 nm to about 50 nm, from about 50 nm to about 100 nm, from about 100 nm to about 150 nm, or from about 150 nm to about 200 nm. In some embodiments, the height $H_3$ of the air gaps 132 is within a range of from about 50 nm to about 100 nm.

The height $H_3$ of the air gaps 132 may be relatively larger than the height $H_1$ of the conductive structures 122 and the height $H_2$ of the dielectric structures 124. The height $H_3$ of the air gaps 132 may be relatively larger than the combined height of the height $H_1$ of the conductive structures 122 and the height $H_2$ of the dielectric structures 124, as shown in FIG. 1F. In some embodiments, the openings 120 have an aspect ratio (e.g., a high aspect ratio (HAR)) within a range of from about 5:1 to about 40:1, such as between about 5:1 and about 10:1, between about 10:1 and about 20:1, or between about 20:1 and about 40:1. The height $H_3$ of the openings 120 and, thus, the air gaps 132 may be relatively less than a depth $D_1$ of the contact structures 110 within the microelectronic device structure 100. The depth $D_1$ may correspond to a distance (e.g., in the Z-direction) between upper surfaces of the dielectric structures 124 and the upper surfaces 110a of the contact structures 110, such that at least some of the first isolation material 102 (e.g., the second residual portions 128 thereof) extends between the air gaps 132 and the upper surfaces 110a of the contact structures 110. In other words, the second residual portions 128 separate the air gaps 132 from the upper surfaces 110a of the contact structures 110.

Still referring to FIG. 1F, the interconnect structures 114 may be formed to individually have a width $W_1$ (e.g., a horizontal dimension in the X-direction), and the contact structures 110 may be formed to individually have a width $W_2$ (e.g., taken from the upper surfaces 110a thereof) larger than the width $W_1$ of the interconnect structures 114. By way of non-limiting example, the width $W_1$ of the interconnect structures 114 may be within a range of from about 10 nm to about 100 nm, such as from about 10 nm to about 20 nm, from about 20 nm to about 30 nm, from about 30 nm to about 50 nm, or from about 50 nm to about 100 nm, and the width $W_2$ of the contact structures 110 may be within a range of from about 20 nm to about 200 nm, such as from about 20 nm to about 50 nm, from about 50 nm to about 100 nm, or from about 100 nm to about 150 nm, or from about 150 nm to about 200 nm. In some embodiments, the width $W_1$ of the interconnect structures 114 is within a range of from about 10 nm to about 50 nm, and the width $W_2$ of the contact structures 110 is within a range of from about 50 nm to about 150 nm.

The openings 120 and, thus, the air gaps 132 (e.g., at a greatest horizontal extent thereof) may be formed to individually have a width $W_3$, and the conductive structures 122 may be formed to individually have a width $W_4$ that is relatively less than the width $W_3$ of the air gaps 132. By way of non-limiting example, the width $W_3$ of the air gaps 132 may be within a range of from about 10 nm to about 100 nm, such as from about 10 nm to about 20 nm, from about 20 nm to about 30 nm, from about 30 nm to about 50 nm, or from about 50 nm to about 100 nm, and the width $W_4$ of the conductive structures 122 may be within a range of from about 10 nm to about 100 nm, such as from about 10 nm to about 20 nm, from about 20 nm to about 30 nm, from about 30 nm to about 50 nm, or from about 50 nm to about 100 nm. In some embodiments, the width $W_3$ of the air gaps 132 is within a range of from about 20 nm to about 100 nm, and the width $W_4$ of the conductive structures 122 is within a range of from about 10 nm to about 60 nm. Further, the width $W_3$ of the air gaps 132 may, for example, be within a range of from about 1 percent to about 500 percent (e.g., from about 10 percent to about 250 percent, from about 25 percent to about 125 percent, from about 50 percent to about 100 percent) larger than the width $W_4$ of the conductive structures 122. In other embodiments, the width $W_4$ of the conductive structures 122 is larger than or, alternatively, substantially equal to the width $W_3$ of the air gaps 132.

Further, a pitch 136 between horizontally adjacent conductive structures 122 may be within a range of from about 20 nm to about 200 nm, such as from about 20 nm to about 50 nm, from about 50 nm to about 100 nm, or from about 100 nm to about 200 nm. The pitch 136 includes a first width 136a corresponding to the width $W_4$ of the conductive structures 122 and a second width 136b corresponding to the width $W_3$ of the air gaps 132. In some embodiments, a ratio of the line width:space width (e.g., a ratio of the width of the conductive structures 122 to the width of the air gaps 132) is less than one (1). In other words, the width $W_4$ of the conductive structures 122 is relatively less than the width $W_3$ of the air gaps 132. Stated another way, the lateral extent of the conductive structures 122 in at least one horizontal direction (e.g., in the X-direction) is a fraction of that of the openings 120 and, thus, the air gaps 132. In some embodiments, the line:space ratio (e.g., the W4:W3 ratio) is substantially even (e.g., 1:1). In other embodiments, the line:space ratio is greater than 1:1 (e.g., 60:40, 70:30, or 80:20). The line:space ratio may be tailored to have a desired value between the width $W_4$ of the conductive structures 122 and the width $W_3$ of the air gaps 132 that may be selected at least partially based on design requirements of the microelectronic device structure 100.

With continued reference to FIG. 1F in combination with FIG. 1E, the microelectronic device structure 100 may include the contact structures 110 on or over the conductive plug structures 106 of the pillar structures 104 and include the interconnect structures 114 on or over the contact structures 110, as described above with reference to FIGS. 1A and 1B. The microelectronic device structure 100 may also include the conductive structures 122 on or over the interconnect structures 114 and include the dielectric structures 124 on or over the conductive structures 122, as described above with reference to FIGS. 1C and 1D. The contact structures 110 may be in contact (e.g., direct physical contact) with the interconnect structures 114, and the interconnect structures 114 may be in contact (e.g., direct physical contact) with the conductive structures 122. Accordingly, the conductive structures 122 may be in electrical contact with the pillar structures 104 through the interconnect structures 114 and the contact structures 110. The conductive structures 122, the interconnect structures 114, and the contact structures 110 may include one or more material compositions that are formulated to lower resistivity of at least some of the conductive structures in order to provide increased conductivity within and between the adjacent conductive structures.

In the embodiment of FIG. 1F, the conductive structures 122 may have a material composition that is different than a material composition of each of the interconnect structures 114 and the contact structures 110. For example, the conductive structures 122 may comprise a material including one or more of titanium, ruthenium, aluminum, and molybdenum and at least one (e.g., each) of the interconnect structures 114 and the contact structures 110 are formed of and include tungsten.

Further, the conductive structures 122 may include a single-phase material (e.g., either a β-phase material or an α-phase material). The conductive structures 122 (e.g., data lines, bit lines) may be formed of and include a conductive material, such as, for example, one or more of tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including one or more of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively doped silicon, conductively doped germanium, conductively doped silicon germanium), polysilicon, and other materials exhibiting electrical conductivity. In some embodiments, the conductive structures 122 comprise a material including one or more of titanium, ruthenium, aluminum, and molybdenum, while being substantially devoid (e.g., substantially absent) of tungsten. In some such embodiments, the conductive structures 122 include at least some atoms of a precursor material (e.g., chlorine, carbon, oxygen) employed from the conductive structures 122. Accordingly, the conductive structures 122 may be substantially devoid (e.g., substantially absent) of the halogen-containing precursors (e.g., fluorine) used in formation of tungsten and the interconnect structures 114 and/or the contact structures 110 may be substantially devoid (e.g., substantially absent) of additional precursors (e.g., chlorine, carbon, oxygen) used in formation of non-tungsten containing materials, such as titanium, ruthenium, aluminum, or molybdenum, for example.

Accordingly, the conductive structures 122 may have a material composition that is different than a material composition of each of the interconnect structures 114 and the contact structures 110. The contact structures 110 and the interconnect structures 114 may comprise tungsten exhibiting different properties than a material of the conductive structures 122. For example, each of the contact structures 110 and the interconnect structures 114 may exhibit a different grain size, different electrical properties, and fewer impurities than the conductive structures 122. In some embodiments, at least portions of the contact structures 110 and/or the interconnect structures 114 comprise tungsten having a larger grain size than a grain size of the material of the conductive structures 122. Since grain size of a material may be based, at least in part, on a thickness (e.g., a height) of the material, the conductive structures 122 may exhibit a grain size within a range of from about 0.1 times to about 10 times the thickness of the conductive structures 122. In some embodiments, the contact structures 110 and/or the interconnect structures 114 exhibit a lower resistivity than the conductive structures 122. Accordingly, the interconnect structures 114 and/or the contact structures 110 exhibit a greater conductivity than the conductive structures 122, in some embodiments. The conductive structures 122 may be formed of and include a material that is tailored for reducing (e.g., minimizing) voids that may occur during formation of the conductive structures 122. Since resistivity of a material may be based, at least in part, on a thickness (e.g., a height) of the material, the conductive structures 122 may exhibit a lower resistivity than the contact structures 110 and/or the interconnect structures 114, in some instances, such as when a thickness of the conductive structures 122 is reduced.

Figure 1G:
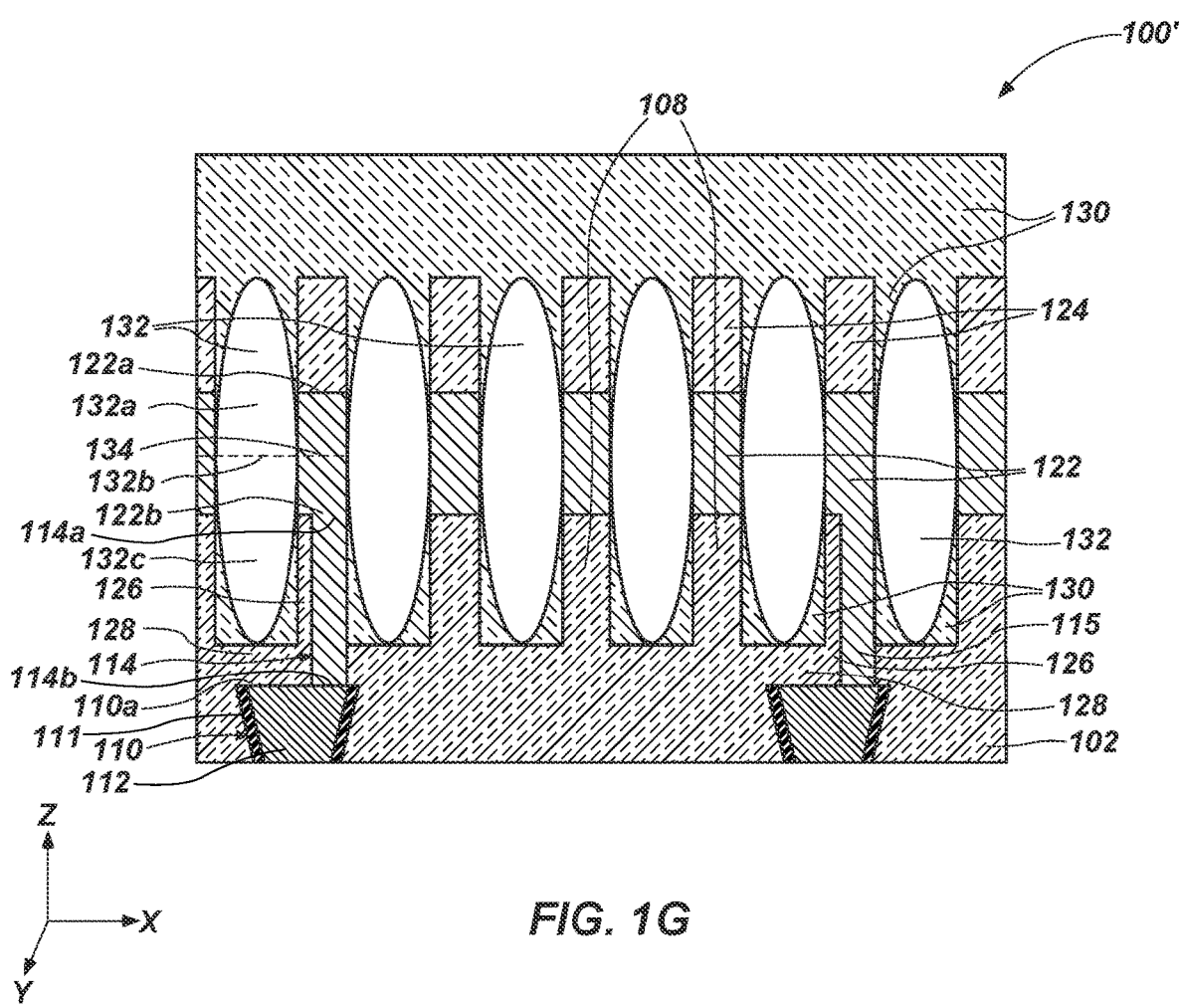

One of ordinary skill in the art will appreciate that, in accordance with additional embodiments of the disclosure, the features and feature configurations described above in relation to FIGS. 1A through 1F may be adapted to design needs of different microelectronic devices (e.g., different memory devices). By way of non-limiting example, in accordance with additional embodiments of the disclosure, FIG. 1G shows a simplified partial cross-sectional view of a method of forming a microelectronic device structure having a different configuration than the microelectronic device structure 100. Throughout the remaining description and the accompanying figures, functionally similar features (e.g., structures, devices) are referred to with similar reference numerals. To avoid repetition, not all features shown in the remaining figures (including FIG. 1G) are described in detail herein. Rather, unless described otherwise below, a feature designated by a reference numeral of a previously described feature (whether the previously described feature is first described before the present paragraph or is first described after the present paragraph) will be understood to be substantially similar to the previously described feature.

FIG. 1G illustrates a simplified partial cross-sectional view of a microelectronic device structure 100'. At the processing stage depicted in FIG. 1G the microelectronic device structure 100' may be substantially similar to the microelectronic device structure 100 at the processing stage depicted in FIG. 1E. Further, FIG. 1G is an enlarged view of a portion of the microelectronic device structure 100 of FIG. 1E.

The microelectronic device structure 100' of FIG. 1G may include the contact structures 110 on or over the conductive plug structures 106 (FIG. 1E) of the pillar structures 104 (FIG. 1E) and include the interconnect structures 114 on or over the contact structures 110, as in the previous embodiment of FIG. 1F. The microelectronic device structure 100' may also include the conductive structures 122 on or over the interconnect structures 114 and include the dielectric structures 124 on or over the conductive structures 122. The contact structures 110 may be in contact (e.g., direct physical contact) with the interconnect structures 114, and the interconnect structures 114 may be in contact (e.g., direct physical contact) with the conductive structures 122. Accordingly, the conductive structures 122 may be in electrical contact with the pillar structures 104 (FIG. 1E) through the interconnect structures 114 and the contact structures 110. However, the conductive structures 122 may have a material composition that is substantially the same as a material composition of the interconnect structures 114 in the embodiment of FIG. 1G. In some such embodiments, each of the conductive structures 122 and the interconnect structures 114 have a material composition that is different than a material composition of the contact structures 110. For example, the conductive structures 122 and the interconnect structures 114 may each comprise a material including one or more of titanium, ruthenium, aluminum, and molybdenum and the contact structures 110 may comprise tungsten. In some embodiments, each of the conductive structures 122 and the interconnect structures 114 comprise a material including one or more of titanium, ruthenium, aluminum, and molybdenum, while being substantially devoid (e.g., substantially absent) of tungsten. In some such embodiments, the conductive structures 122 and the interconnect structures 114 may individually include at least some atoms of a precursor material (e.g., chlorine, carbon, oxygen) employed to from the conductive structures 122 and the interconnect structures 114. Accordingly, the conductive structures 122 and the interconnect structures 114 may individually be substantially devoid (e.g., substantially absent) of the halogen-containing precursors (e.g., fluorine) used in formation of tungsten and the contact structures 110 may be substantially devoid (e.g., substantially absent) of additional precursors (e.g., chlorine, carbon, oxygen) used in formation of non-tungsten containing materials, such as titanium, ruthenium, aluminum, or molybdenum, for example.

The contact structures 110 and/or the interconnect structures 114 may be grown, deposited (e.g., by ALD, CVD, pulsed CVD, metal organic CVD, PVD) within the respective contact openings and openings within the first isolation material 102, as in the previous embodiment of FIG. 1F. However, in the embodiment of FIG. 1G, the interconnect structures 114 may include a material composition that is substantially the same as the material composition of the conductive structures 122 (e.g., a single-phase material) without including the liner material 113 (FIG. 1F) within the openings of the first isolation material 102. Further, there may be no easily discernable physical interface between the lower surfaces 122*b* of the conductive structures 122 and the upper surfaces 114*a* of the interconnect structures 114, as shown in FIG. 1G. In some embodiments, the conductive structures 122 are formed during formation of the interconnect structures 114. For example, the conductive structures 122 may be formed substantially simultaneously with the formation of the interconnect structures 114 in order to simplify manufacturing processes. Accordingly, the conductive structures 122, the interconnect structures 114, and the contact structures 110 may include one or more material compositions that are formulated to lower resistivity of at least some of the conductive structures in order to provide increased conductivity within and between the adjacent conductive structures.

As described above, forming the microelectronic device structure 100 of the embodiment of FIG. 1F to include the conductive structures 122 formed of a first material composition (e.g., titanium, ruthenium, aluminum, and molybdenum) and the contact structures 110 and the interconnect structures 114 formed of a second, different material composition (e.g., tungsten) or, alternatively, forming the microelectronic device structure 100' of the embodiment of FIG. 1G to include the conductive structures 122 and the interconnect structures 114 formed of a first material composition (e.g., titanium, ruthenium, aluminum, and molybdenum) and the contact structures 110 formed of a second, different material composition (e.g., tungsten) may facilitate improved performance of the microelectronic device structures 100, 100'.

For example, the differing materials of the adjacent structures (e.g., the conductive structures 122 in combination with the contact structures 110 and/or the interconnect structures 114) may provide a reduced resistivity (e.g., electrical resistance levels) of the conductive material. In some embodiments, the electrical resistance exhibited by the conductive material may be from about 1% to about 50%, or even a higher percentage, less than the electrical resistance of conductive material of a conventional structure of a 3D NAND structure. For example, where a conventional conductive structure may exhibit an electrical resistance of about 13 $\Omega\cdot\mu m$, the conductive structures of the embodiments of the disclosure may exhibit an electrical resistance of about 5 $\Omega\cdot\mu m$. The lower electrical resistance may be achieved without necessitating an increase to the pitch or critical dimension (CD) of the adjacent structures. Accordingly, reduced resistivity may be achieved, even while the pitch or CD of the adjacent structures continue to be scaled down to smaller values and while thicknesses (e.g., a height in the Z-direction) of the conductive structures continue to be reduced.

In addition, since the contact structures 110 and/or the interconnect structures 114 having a second, different material composition are formed adjacent the conductive structures 122 having a first material composition, at least one of the contact structures 110 and the interconnect structures 114 may exhibit a lower resistivity relative to the conductive structures 122. Since the conductive structures 122 may be formed of and include a material composition that is tailored for reducing (e.g., minimizing) voids, the conductive structures 122 may be selected for improved properties in forming (e.g., depositing, growing) such materials and the contact structures 110 and/or the interconnect structures 114 may be selected for improved properties (e.g., reduced resistivity) during use and operation of the microelectronic device structure 100. Alternatively, since the conductive structures 122 and the interconnect structures 114 may be formed of and include a material composition that is tailored for reducing (e.g., minimizing) voids, the conductive structures 122 and the interconnect structures 114 may be selected for improved properties in forming (e.g., depositing, growing) such materials and the contact structures 110 may be selected for improved properties (e.g., reduced resistivity) during use and operation of the microelectronic device structure 100'. Further, the conductive structures 122 and in some instances, the interconnect structures 114, may not include halides, such as fluorine, which may be present in conductive structures formed with halide-containing precursors. The reduced resistivity of the conductive structures may improve performance of the microelectronic device structures 100, 100'.

Microelectronic device structures formed according to embodiments described herein may exhibit improved performance by providing reduced occurrences of voids during formation of the conductive materials (e.g., the conductive structures 122). Additional performance improvements may be achieved by the conductive structures 122 comprising a first material composition and the contact structures 110 and/or the interconnect structures 114 comprising a second, different material composition, or alternatively, by the conductive structures 122 and the interconnect structures 114 comprising a first material composition and the contact structures 110 comprising a second, different material composition, which configurations may exhibit improved performance compared to conventional microelectronic device structures.

Furthermore, by using the subtractive process, a critical dimension (e.g., a width) of the conductive structures 122 may be relatively less than a critical dimension (e.g., a width) of the air gaps 132 laterally intervening therebetween, which reduces parasitic capacitance between the adjacent conductive structures 122. Since the openings 120 are laterally adjacent to the conductive structures 122, with a portion of the openings 120 extending above a plane of the upper surface 122a of the laterally adjacent conductive structures 122 (e.g., laterally adjacent the dielectric structures 124) and a portion of the openings 120 extending below a plane of the lower surface 122b of the laterally adjacent conductive structures 122 (e.g., laterally adjacent the dielectric structures 124 and the first isolation material 102), the air gaps 132 located within the openings 120 are laterally adjacent to the conductive structures 122, with a portion of the air gaps 132 extending above a plane of the upper surface 122a of the laterally adjacent conductive structures 122 and a portion of the air gaps 132 extending below a plane of the lower surface 122b of the laterally adjacent conductive structures 122, further reducing the parasitic capacitance between the adjacent conductive structures 122. The air gaps 132 according to embodiments of the disclosure may reduce the capacitance between neighboring conductive structures 122 by up to 65%. The reduced capacitance may, in turn, provide a reduced programming time of between about 5% and about 10%, in some instances. Extending the air gaps 132 below the conductive structures 122 also allows for reduced parasitic capacitance between laterally neighboring interconnect structures 114. By lowering parasitic capacitance between the adjacent conductive structures 122 using the air gaps 132, the differing material compositions (e.g., low resistivity conductive materials) may be used within the conductive structures 122, the interconnect structures 114, and/or the contact structures 110. In addition, at least one critical dimension (e.g., a width, a height) of the conductive structures 122 may be relatively less than that of conventional conductive lines (e.g., bit lines) of conventional device structures by using the subtractive approach and resulting materials. As a result, the RC (product of resistance and capacitance) of the conductive structures 122 may be optimized, which may correlate to an increase in the performance of an apparatus containing the microelectronic device structures 100, 100' by allowing for a reduction in operational speed (e.g., programming time). Furthermore, the methods of the disclosure may reduce or eliminate process acts, such as the formation of etch-stop materials, utilized to form many conventional apparatuses that may be used for similar operations as the microelectronic device structures 100, 100'. By using a single material removal act within a single chamber, the microelectronic device structures 100, 100' according to embodiments of the disclosure are formed utilizing fewer process acts than conventional device structures. In some instances, the process acts may be reduced by half of that of conventional process acts.

Thus, in accordance with embodiments of the disclosure, a microelectronic device comprises pillar structures extending vertically through an isolation material, conductive lines electrically coupled to the pillar structures, contact structures between the pillar structures and the conductive lines, and interconnect structures between the conductive lines and the contact structures. The conductive lines comprise one or more of titanium, ruthenium, aluminum, and molybdenum. The interconnect structures comprise a material composition that is different than one or more of a material composition of the contact structures and a material composition of the conductive lines.

Furthermore, in accordance with additional embodiments of the disclosure, a method of forming a microelectronic device comprises forming pillar structures extending vertically through an isolation material, forming contact structures over the pillar structures, forming interconnect structures over the contact structures, and forming conductive lines electrically coupled to the pillar structures through the contact structures and the interconnect structures. The conductive lines comprise one or more of titanium, ruthenium, aluminum, and molybdenum, and the interconnect structures comprise a material composition that is different than one or more of a material composition of the contact structures and a material composition of the conductive lines.

Figure 2:
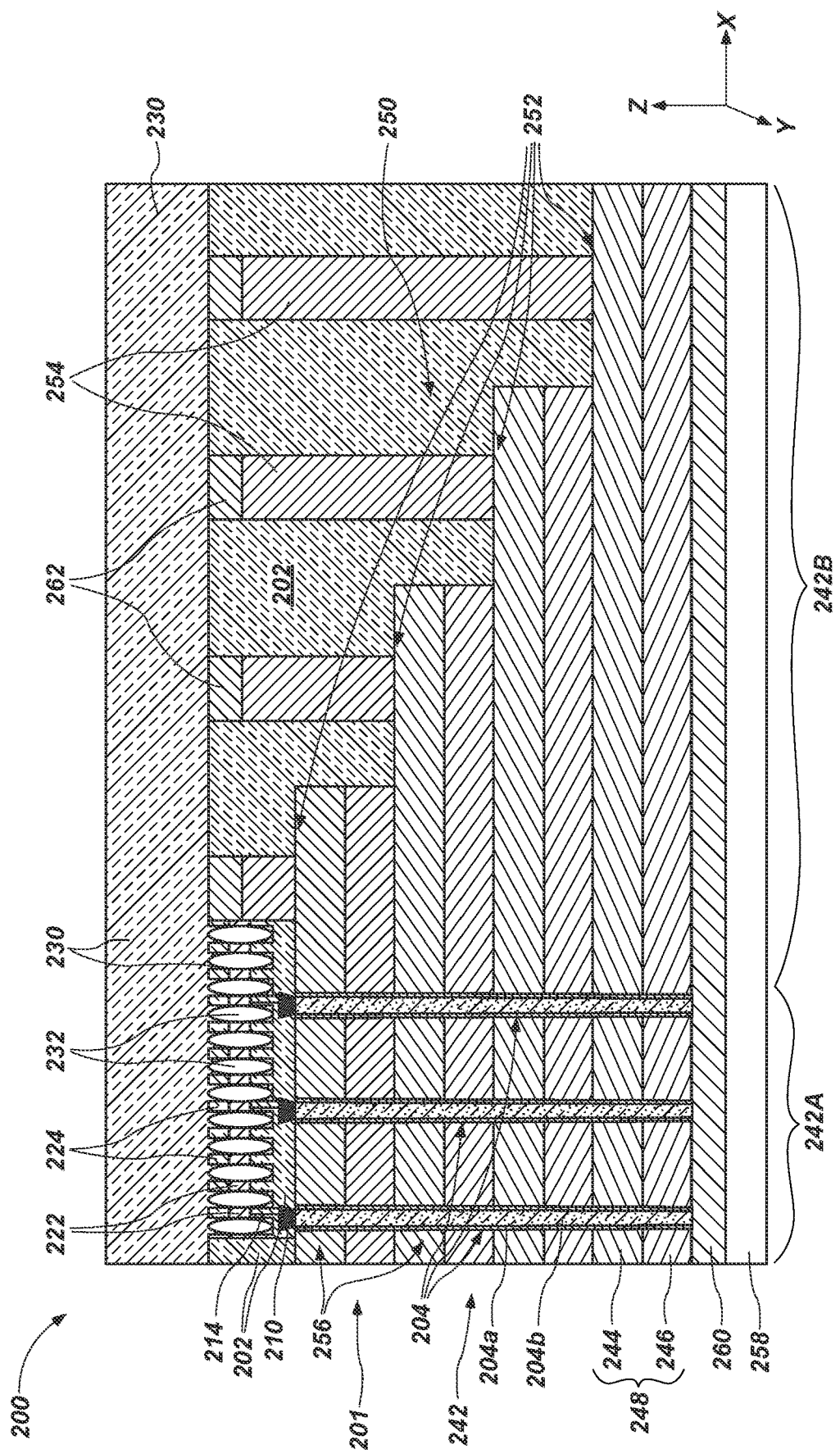
FIG. 2 is a simplified partial cross-sectional view of a microelectronic device formed through the method described with reference to FIGS. 1A through 1G, in accordance with embodiments of the disclosure.

Microelectronic device structures (e.g., the microelectronic device structures 100, 100' following the processing previously described with reference to FIGS. 1A through 1G) according to embodiments of the disclosure may be included in microelectronic devices (e.g., memory devices, such as 3D NAND Flash memory devices). For example, FIG. 2 illustrates a simplified partial cross-sectional view of a microelectronic device 201 including a microelectronic device structure 200. The microelectronic device structure 200 may be substantially similar to the microelectronic device structures 100, 100' following processing previously described with reference to FIGS. 1A through 1G. Throughout FIG. 2 and the associated description below, features (e.g., structures, materials, regions) functionally similar to features of the microelectronic device structures 100, 100' previously described with reference to one or more of FIGS. 1A through 1G are referred to with similar reference numerals incremented by 100. To avoid repetition, not all features shown in FIG. 2 are described in detail herein. Rather, unless described otherwise below, in FIG. 2, a feature designated by a reference numeral that is a 100 increment of the reference numeral of a feature previously described with reference to one or more of FIGS. 1A through 1G will be understood to be substantially similar to and formed in substantially the same manner as the previously described feature.

As shown in FIG. 2, the microelectronic device structure 200 (including the components thereof previously described with reference to one or more of FIGS. 1A through 1G) of the microelectronic device 201 may be operatively associated with a stack structure 242 of the microelectronic device 201. The stack structure 242 includes a vertically alternating (e.g., in the Z-direction) sequence of additional conductive structures 244 (e.g., access lines, word lines) and insulative structures 246 arranged in tiers 248. In addition, as shown in FIG. 2, the stack structure 242 includes a memory array region 242A, and a staircase region 242B horizontally neighboring (e.g., in the X-direction) the memory array region 242A. As described in further detail below, the microelectronic device 201 further includes additional components (e.g., features, structures, devices) within horizontal boundaries of the different regions (e.g., the memory array region 242A and the staircase region 242B) of the stack structure 242.

The tiers 248 of the stack structure 242 of the microelectronic device 201 may each individually include at least one of the additional conductive structures 244 vertically neighboring at least one of the insulative structures 246. The stack structure 242 may include a desired quantity of tiers 248. For example, the stack structure 242 may include greater than or equal to eight (8) of the tiers 248, greater than or equal to sixteen (16) of the tiers 248, greater than or equal to thirty-two (32) of the tiers 248, greater than or equal to sixty-four (64) of the tiers 248, greater than or equal to one hundred twenty-eight (128) of the tiers 248, or greater than or equal to two hundred fifty-six (256) of the tiers 248 of the additional conductive structures 244 and the insulative structures 246.

The additional conductive structures 244 of the tiers 248 of the stack structure 242 may be formed of and include at least one electrically conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide). In some embodiments, the additional conductive structures 244 are formed of and include a metallic material (e.g., a metal, such as tungsten; an alloy). In other embodiments, the additional conductive structures 244 are formed of and include one or more of titanium, ruthenium, aluminum, and molybdenum, while being substantially devoid (e.g., substantially absent) of tungsten. In additional embodiments, the additional conductive structures 244 are formed of and include conductively doped polysilicon. Each of the additional conductive structures 244 may individually be substantially homogeneous, or one or more of the additional conductive structures 244 may individually be substantially heterogeneous. In some embodiments, each of the additional conductive structures 244 of the stack structure 242 is substantially homogeneous. In additional embodiments, at least one (e.g., each) of the additional conductive structures 244 of the stack structure 242 is heterogeneous. An individual additional conductive structure 244 may, for example, be formed of and include a stack of at least two different electrically conductive materials. The additional conductive structures 244 of each of the tiers 248 of the stack structure 242 may each be substantially planar and may each exhibit a desired thickness.

The insulative structures 246 of the tiers 248 of the stack structure 242 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative structures 246 are formed of and include $SiO_2$. Each of the insulative structures 246 may individually be substantially homogeneous, or one or more of the insulative structures 246 may individually be substantially heterogeneous. In some embodiments, each of the insulative structures 246 of the stack structure 242 is substantially homogeneous. In additional embodiments, at least one (e.g., each) of the insulative structures 246 of the stack structure 242 is heterogeneous. An individual insulative structure 246 may, for example, be formed of and include a stack of at least two different dielectric materials. The insulative structures 246 of each of the tiers 248 of the stack structure 242 may each be substantially planar and may each individually exhibit a desired thickness.

At least one lower additional conductive structure 244 of the stack structure 242 may be employed as at least one lower select gate (e.g., at least one source side select gate (SGS)) of the microelectronic device 201. In some embodiments, a single (e.g., only one) additional conductive structure 244 of a vertically lowermost tier 248 of the stack structure 242 is employed as a lower select gate (e.g., a SGS) of the microelectronic device 201. In some embodiments, upper conductive structure(s) 244 of the stack structure 242 may be employed as upper select gate(s) (e.g., drain side select gate(s) (SGDs)) of the microelectronic device 201. In some embodiments, horizontally neighboring (e.g., in the Y-direction) additional conductive structures 244 of a vertically uppermost tier 248 of the stack structure 242 are employed as upper select gates (e.g., SGDs) of the microelectronic device 201. In yet other embodiments, upper select gates of the microelectronic device 201 may be located vertically above the stack structure 242 (e.g., within an additional stack structure of a multi-stack device) overlying the stack structure 242.

Still referring to FIG. 2, within horizontal boundaries (e.g., in the X-direction and the Y-direction) of the memory array region 242A of the stack structure 242, the microelectronic device 201 may include pillar structures 204 vertically extending through the stack structure 242. As shown in FIG. 2, the pillar structures 204 may be formed to vertically extend substantially completely through the stack structure 242. The pillar structures 204, including a channel material of cell film 204a surrounding a fill material 204b, may correspond to the pillar structures 104, including the channel material of cell film 104a surrounding the fill material 104b, previously described herein with reference to FIG. 1A. For clarity and ease of understanding the drawings and associated description, conductive plug structures 206 are absent in FIG. 2, and are depicted and described above with reference to FIG. 1A as the conductive plug structures 106.

The microelectronic device structure 200 may be formed to include a desired quantity (e.g., number, amount) of the pillar structures 204. While FIG. 2 depicts the microelectronic device structure 200 as being formed to include three (3) of the pillar structures 204, the microelectronic device structure 200 may be formed to include more than three (3) (e.g., greater than or equal to eight (8), greater than or equal to sixteen (16), greater than or equal to thirty-two (32), greater than or equal to sixty-four (64), greater than or equal to one hundred twenty-eight (128), greater than or equal to two hundred fifty-six (256)) of the pillar structures 204. Intersections of the pillar structures 204 and the additional conductive structures 244 of the tiers 248 of the stack structure 242 may define vertically extending strings of memory cells 256 coupled in series with one another within the memory array region 242A of the stack structure 242. In some embodiments, the memory cells 256 formed at the intersections of the additional conductive structures 244 and the pillar structures 204 within each the tiers 248 of the stack structure 242 comprise so-called "MONOS" (metal-oxide-nitride-oxide-semiconductor) memory cells. In additional embodiments, the memory cells 256 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, memory cells 256 comprise so-called "floating gate" memory cells including floating gates (e.g., metallic floating gates) as charge storage structures. The floating gates may horizontally intervene between central structures of the pillar structures 204 and the additional conductive structures 244 of the different tiers 248 of the stack structure 242. The microelectronic device 201 may include any desired quantity and distribution of the pillar structures 204 within the memory array region 242A of the stack structure 242.

The microelectronic device 201 may further include conductive structures 222 (e.g., digit lines, data lines, bit lines) vertically overlying the stack structure 242, at least one source structure 260 (e.g., source line, source plate) vertically underlying the stack structure 242, and at least one control device 258 vertically underlying the source structure 260. The pillar structures 204 may vertically extend between (e.g., in the Z-direction) the conductive structures 222 and the source structure 260. The source structure 260 may vertically extend between the stack structure 242 and the control device 258. The conductive structures 222 and the source structure 260 may each individually be formed of and include at least one electrically conductive material, such as one or more of a metal, an alloy, a conductive metal oxide, a conductive metal nitride, a conductive metal silicide, and a conductively doped semiconductor material. By way of non-limiting example, the conductive structures 222 and/or the source structure 260 may be formed of and include one or more of W, WNy, Ni, Ta, TaNy, TaSix, Pt, Cu, Ag, Au, Al, Mo, Ti, TiNy, TiSix, TiSixNy, TiAlxNy, MoNx, Ir, IrOz, Ru, RuOz, at least one conductively doped semiconductor material (e.g., conductively doped polysilicon, conductively doped Ge, conductively doped SiGe). The microelectronic device 201 may further include dielectric structures 224 on or over the conductive structures 222 and air gaps 232 horizontally adjacent to neighboring conductive structures 222. The dielectric structures 224 and the air gaps 232 may respectively correspond to the dielectric structures 124 and the air gaps 132 previously described with reference to FIGS. 1D through 1G.

With continued reference to FIG. 2, the control device 258 may include devices and circuitry for controlling various operations of other components of the microelectronic device structure 200. By way of non-limiting example, the control device 258 may include one or more (e.g., each) of charge pumps (e.g., $V_{CCP}$ charge pumps, $V_{NEGWL}$ charge pumps, DVC2 charge pumps); delay-locked loop (DLL) circuitry (e.g., ring oscillators); drain supply voltage ($V_{dd}$) regulators; devices and circuitry for controlling column operations for arrays (e.g., arrays of vertical memory strings) to subsequently be formed within the microelectronic device structure 200, such as one or more (e.g., each) of decoders (e.g., column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices; and devices and circuitry for controlling row operations for arrays (e.g., arrays of vertical memory strings) within memory regions of the microelectronic device structure 200, such as one or more (e.g., each) of decoders (e.g., row decoders), drivers (e.g., word line (WL) drivers), repair circuitry (e.g., row repair circuitry), memory test devices, MUX, ECC devices, and self-refresh/wear leveling devices. In some embodiments, the control device 258 includes CMOS (complementary metal-oxide-semiconductor) circuitry. In such embodiments, control device 258 may be characterized as having a "CMOS under Array" ("CuA") configuration.

Within horizontal boundaries of the staircase region 242B of the stack structure 242, the stack structure 242 may include at least one staircase structure 250. The staircase structure 250 includes steps 252 at least partially defined by horizontal ends (e.g., in the X-direction) of tiers 248. The steps 252 of the staircase structure 250 may serve as contact regions to electrically couple the additional conductive structures 244 of the tiers 248 of the stack structure 242 to other components (e.g., features, structures, devices) of the microelectronic device 201, as described in further detail below. The staircase structure 250 may include a desired quantity of steps 252. In addition, as shown in FIG. 2, in some embodiments, the steps 252 of each of the staircase structure 250 are arranged in order, such that steps 252 directly horizontally adjacent (e.g., in the X-direction) one another correspond to tiers 248 of the stack structure 242 directly vertically adjacent (e.g., in the Z-direction) one another. In additional embodiments, the steps 252 of the staircase structure 250 are arranged out of order, such that at least some steps 252 of the staircase structure 250 directly horizontally adjacent (e.g., in the X-direction) one another correspond to tiers 248 of stack structure 242 not directly vertically adjacent (e.g., in the Z-direction) one another.

Still referring to FIG. 2, the microelectronic device 201 may further include lower conductive structures 254 (e.g., conductive contact structures, such as word line contact structures) physically and electrically contacting at least some (e.g., each) of the steps 252 of the staircase structure 250 of the stack structure 242 to provide electrical access to the additional conductive structures 244 of the stack structure 242. The lower conductive structures 254 may be coupled to the additional conductive structures 244 of the tiers 248 of the stack structure 242 at the steps 252 of the staircase structure 250. As shown in FIG. 2, the lower conductive structures 254 may physically contact and upwardly vertically extend (e.g., in the positive Z-direction) from the additional conductive structures 244 at the steps 252 of the staircase structure 250 to lower contact structures 262 of additional structures (e.g., access devices, vertical transistors) that may be on or over the lower contact structures 262.

The microelectronic device 201 may further include a first isolation material 202 on or over the stack structure 242 and a second isolation material 230 on or over the first isolation material 202. The first isolation material 202 and the second isolation material 230 may respectively correspond to the first isolation material 102 and the second isolation material 130 of the previously described with reference to FIGS. 1A through 1G. As shown in FIG. 2, the first isolation material 202 may be vertically interposed (e.g., in the Z-direction) between the stack structure 242 and the second isolation material 230. The first isolation material 202 may substantially cover the staircase structure 250 within the staircase region 242B of the stack structure 242, and may substantially surround side surfaces (e.g., sidewalls) of the lower conductive structures 254 on the steps 252 of the staircase structure 250. The first isolation material 202 may exhibit a substantially planar upper vertical boundary, and a substantially non-planar lower vertical boundary complementary to the topography of at least the stack structure 242 (including the staircase structure 250 thereof) thereunder. The second isolation material 230 may substantially cover upper surfaces of the dielectric structures 224 within the memory array region 242A of the stack structure 242. The second isolation material 230 may be formed to seal unfilled spaces between the neighboring conductive structures 222 to form the air gaps 232 (e.g., voids, unfilled volumes) therebetween. The air gaps 232 are laterally adjacent to the conductive structures 222, with a portion of the air gaps 232 extending above a plane of an upper surface of the laterally adjacent conductive structures 222 (e.g., laterally adjacent the dielectric structures 224) and a portion of the air gaps 232 extending below a plane of a lower surface of the laterally adjacent conductive structures 222 (e.g., laterally adjacent the interconnect structures 214 and/or segments of the first isolation material 202). In some embodiments, portions of the second isolation material 230 may be laterally adjacent to side surfaces (e.g., sidewalls) of the first isolation material 202. Contact structures 210 may be located on or over uppermost surfaces of the conductive plug structures 206 within upper portions of the pillar structures 204. The contact structures 210 may correspond to the contact structures 110 previously described herein with reference to FIG. 1A.

Thus, in accordance with additional embodiments of the disclosure, a memory device comprises vertically extending strings of memory cells, access lines in electrical communication with the vertically extending strings of memory cells and extending in a first horizontal direction, and data lines in electrical communication with the vertically extending strings of memory cells and extending in a second horizontal direction, substantially transverse to the first horizontal direction. The memory device comprises interconnect structures vertically interposed between and in electrical communication with the data lines and the vertically extending strings of memory cells, and contact structures vertically interposed between and in electrical communication with the interconnect structures and the vertically extending strings of memory cells. The contact structures comprise tungsten and the data lines comprise a single-phase material comprising ruthenium or molybdenum.

Figure 3:
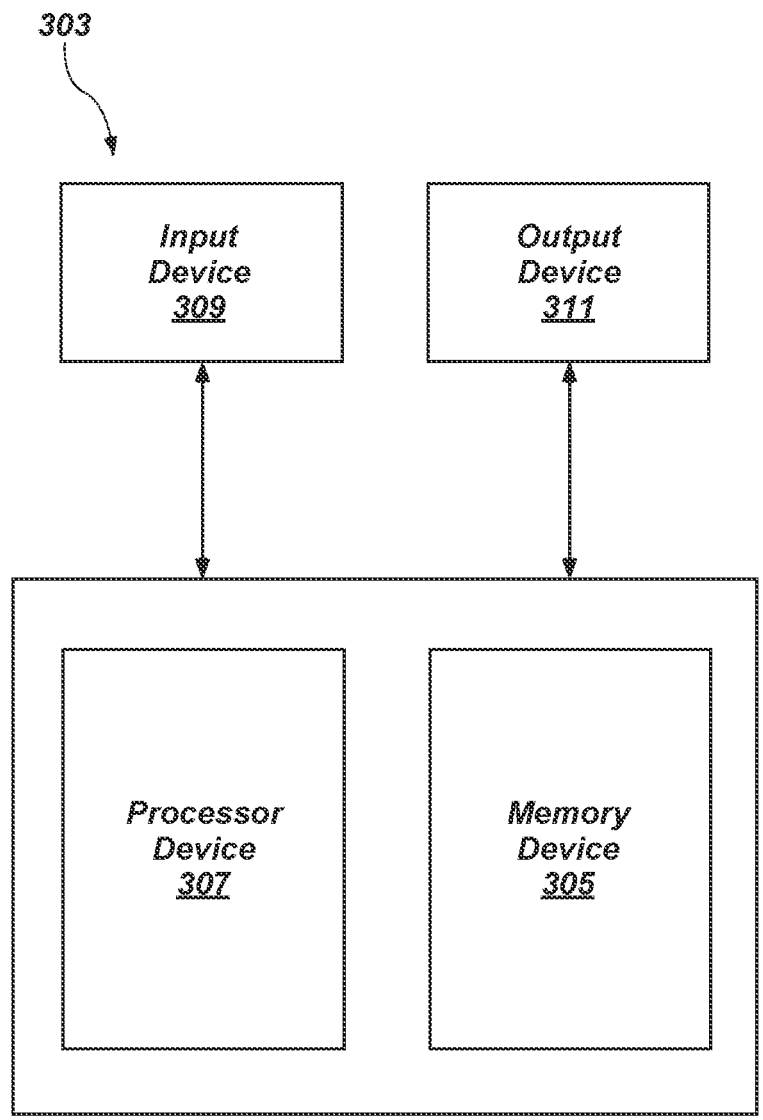
FIG. 3 is a block diagram of an electronic system, in accordance with embodiments of the disclosure.

Microelectronic devices including microelectronic devices (e.g., the microelectronic device 201) and microelectronic device structures (e.g., the microelectronic device structures 100, 100', 200) including the conductive structures 122 comprising a first material composition and the contact structures 110 and/or the interconnect structures 114 comprising a second, different material composition, or alternatively, the conductive structures 122 and the interconnect structures 114 comprising a first material composition and the contact structures 110 comprising a second, different material composition, in according embodiments of the disclosure may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structures 100, 100', 200) or a microelectronic device (e.g., the microelectronic device 201) previously described with reference to FIG. 1A through FIG. 1G and FIG. 2) including the differing material compositions of the conductive structures 122, the interconnect structures 114, and the contact structures 110.

The electronic system 303 may further include at least one electronic signal processor device 307 (often referred to as a "microprocessor"). The electronic signal processor device 307 may, optionally, include an embodiment of a microelectronic device or a microelectronic device structure previously described herein (e.g., one or more of the microelectronic device 201 or the microelectronic device structures 100, 100', 200 previously described with reference to FIG. 1A through FIG. 1G and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

With reference to FIG. 4, depicted is a processor-based system 400. The processor-based system 400 may include various microelectronic devices and microelectronic device structures (e.g., microelectronic devices and microelectronic device structures including one or more of the microelectronic device 201 or the microelectronic device structures 100, 100', 200) manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic devices and microelectronic device structures (e.g., microelectronic devices and microelectronic device structures including one or more of the microelectronic device 201 or the microelectronic device structures 100, 100', 200) manufactured in accordance with embodiments of the disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random-access memory (STT-MRAM), magnetic random-access memory (MRAM), dynamic random-access memory (DRAM), static random-access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic devices and microelectronic device structures (e.g., the microelectronic device 201 and the microelectronic device structures 100, 100', 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices and microelectronic device structures (e.g., the microelectronic device 201 and the microelectronic device structures 100, 100', 200) described above, or a combination thereof.

Accordingly, in at least some embodiments, an electronic system comprises an input device, an output device, a processor device operably coupled to the input device and the output device, and a memory device operably coupled to the processor device and comprising at least one microelectronic device. The at least one microelectronic device comprises strings of memory cells vertically extending through a stack structure comprising vertically alternating sequences of insulative structures and conductive structures arranged in tiers, additional conductive structures substantially devoid of tungsten overlying the strings of memory cells, and interconnect structures between the strings of memory cells and the additional conductive structures. The interconnect structures comprise a beta-phase tungsten liner material substantially surrounding an alpha-phase tungsten fill material.

The microelectronic device structures, devices, and systems of the disclosure advantageously facilitate one or more of improved simplicity, greater packaging density, and increased miniaturization of components as compared to conventional structures, conventional devices, and conventional systems. The methods and structures of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A memory device, comprising:
vertically extending strings of memory cells;
access lines in electrical communication with the vertically extending strings of memory cells and extending in a first horizontal direction;
data lines in electrical communication with the vertically extending strings of memory cells and extending in a second horizontal direction, substantially transverse to the first horizontal direction, the data lines comprising a single-phase material comprising ruthenium or molybdenum;
interconnect structures vertically interposed between and in electrical communication with the data lines and the vertically extending strings of memory cells, the interconnect structures under and in direct physical contact with the data lines, at least one side surface of the data lines vertically aligned with a side surface of the interconnect structures, and the interconnect structures comprising an alpha-phase tungsten fill material and a beta-phase tungsten liner material laterally adjacent to the alpha-phase tungsten fill material; and
contact structures vertically interposed between and in electrical communication with the interconnect structures and the vertically extending strings of memory cells, the contact structures comprising tungsten.

2. The memory device of claim 1, further comprising air gaps separating the data lines in the first horizontal direction, wherein a width of the air gaps in the first horizontal direction is relatively larger than a width of the data lines in the first horizontal direction.

3. The memory device of claim 2, wherein a portion of the air gaps extend vertically above a plane of an upper surface of laterally adjacent data lines and a portion of the air gaps extend vertically below a plane of a lower surface of the laterally adjacent data lines.

4. The memory device of claim 1, wherein the interconnect structures comprise at least one N-type dopant comprising one or more of phosphorus, arsenic, antimony, and bismuth.

5. The memory device of claim 1, further comprising a first isolation material laterally adjacent to the interconnect structures on a first side thereof and a second isolation material laterally adjacent to the interconnect structures on a second, opposing side thereof.

6. An electronic system, comprising:
an input device;
an output device;
a processor device operably coupled to the input device and the output device; and
a memory device operably coupled to the processor device and comprising at least one microelectronic device, the at least one microelectronic device comprising:
strings of memory cells vertically extending through a stack structure comprising vertically alternating sequences of insulative structures and conductive structures arranged in tiers;
data lines substantially devoid of tungsten overlying the strings of memory cells, the data lines extending in a horizontal direction substantially orthogonal to an additional horizontal direction in which the conductive structures of the stack structure extend, a critical dimension of the data lines in the additional horizontal direction relatively less than a critical dimension between neighboring data lines; and
interconnect structures between the strings of memory cells and the data lines, the interconnect structures comprising a beta-phase tungsten liner material substantially surrounding an alpha-phase tungsten fill material.

7. The electronic system of claim 6, wherein the interconnect structures are laterally adjacent an oxide material without being laterally adjacent a nitride material.

8. The electronic system of claim 6, wherein the memory device comprises a 3D NAND Flash memory device.

9. The electronic system of claim 6, further comprising contact structures between the strings of memory cells and the interconnect structures, wherein a vertical centerline of the interconnect structures is off-center from a vertical centerline of the contact structures.

10. The electronic system of claim 6, further comprising dielectric structures overlying the data lines, at least one lateral side surface of each of the dielectric structures, the data lines, and the interconnect structures substantially coplanar with one another.

11. The electronic system of claim 6, further comprising a complementary metal-oxide-semiconductor (CMOS) under array (CUA) region at least partially positioned within horizontal boundaries of and vertically below a region of the stack structure containing the strings of memory cells.

12. A memory device, comprising:
a stack structure comprising dielectric materials and conductive materials vertically alternating with the dielectric materials;

pillar structures comprising a channel material vertically extending through the stack structure;

conductive contacts overlying the pillar structures;

interconnect structures overlying the conductive contacts;

data lines overlying the interconnect structures and operably coupled with the pillar structures through the conductive contacts and the interconnect structures; and dielectric structures overlying the data lines, at least one outer side surface of an interconnect structure, a side surface of a corresponding data line, and a side surface of a corresponding dielectric structure substantially vertically aligned with one another, and an additional, opposing outer side surface of each of the data lines and the dielectric structures substantially vertically aligned with one another.

13. The memory device of claim 12, wherein the at least one outer side surface of the interconnect structure is substantially vertically aligned with a side surface of a corresponding conductive contact.

14. The memory device of claim 12, further comprising an additional isolation material vertically and horizontally adjacent to the dielectric structures, portions of the additional isolation material horizontally adjacent to the interconnect structures.

15. The memory device of claim 12, further comprising air gaps laterally adjacent to the data lines, individual air gaps partially defined by outer side surfaces of adjacent data lines.

16. The memory device of claim 15, wherein upper portions of the air gaps are laterally adjacent to the dielectric structures.

17. The memory device of claim 15, wherein lower portions of the air gaps are laterally adjacent to the interconnect structures.

18. A memory device, comprising:

a stack structure comprising dielectric materials and conductive materials vertically alternating with the dielectric materials;

pillar structures comprising a channel material vertically extending through the stack structure;

conductive contacts overlying the pillar structures;

interconnect structures overlying the conductive contacts;

data lines overlying the interconnect structures and operably coupled with the pillar structures through the conductive contacts and the interconnect structures;

dielectric structures overlying the data lines, at least one outer side surface of an interconnect structure, a side surface of a corresponding data line, and a side surface of a corresponding dielectric structure substantially vertically aligned with one another; and an isolation material adjacent to the pillar structures, wherein the isolation material comprises L-shaped structures individually comprising a first portion vertically extending along an additional, opposing outer side surface of the interconnect structures and a second portion extending between the first portion and the conductive contacts.

* * * * *

UNITED STATES PATENT AND TRADEMARK OFFICE
CERTIFICATE OF CORRECTION

PATENT NO. : 12,113,019 B2
APPLICATION NO. : 18/148662
DATED : October 8, 2024
INVENTOR(S) : John D. Hopkins, Jordan D. Greenlee and Marko Milojevic Page 1 of 1

It is certified that error appears in the above-identified patent and that said Letters Patent is hereby corrected as shown below:

In the Specification

Column 5, Line 25, change "oxide ($MgO_x$), at" to --oxide ($MgO_x$)), at--

Column 14, Line 63, change "the alpha (α) phase." to --the alpha- (α-) phase.--

Signed and Sealed this
Twenty-sixth Day of November, 2024

Katherine Kelly Vidal
*Director of the United States Patent and Trademark Office*